(12) United States Patent
Liu et al.

(10) Patent No.: US 11,572,270 B2
(45) Date of Patent: Feb. 7, 2023

(54) 3D-STRUCTURED SENSORS HAVING STRETCHABLE MULTI-FUNCTIONAL TACTILE ELECTRONIC HAIRS

(71) Applicant: NANYANG TECHNOLOGICAL UNIVERSITY, Singapore (SG)

(72) Inventors: Zhiyuan Liu, Singapore (SG); Dianpeng Qi, Singapore (SG); Bo Gunnar Liedberg, Singapore (SG); Xiaodong Chen, Singapore (SG)

(73) Assignee: NANYANG TECHNOLOGICAL UNIVERSITY, Singapore (SG)

( * ) Notice: Subject to any disclaimer, the term of this patent is extended or adjusted under 35 U.S.C. 154(b) by 327 days.

(21) Appl. No.: 16/649,602

(22) PCT Filed: Sep. 24, 2018

(86) PCT No.: PCT/SG2018/050485
§ 371 (c)(1),
(2) Date: Mar. 20, 2020

(87) PCT Pub. No.: WO2019/059849
PCT Pub. Date: Mar. 28, 2019

(65) Prior Publication Data
US 2020/0277184 A1    Sep. 3, 2020

(30) Foreign Application Priority Data
Sep. 22, 2017   (SG) ............................ 10201707830V

(51) Int. Cl.
*B81C 1/00*      (2006.01)
(52) U.S. Cl.
CPC ........ *B81C 1/0019* (2013.01); *B81C 1/00206* (2013.01); *B81B 2201/0292* (2013.01)

(58) Field of Classification Search
CPC .............. B81C 1/0019; B81C 1/00206; B81C 2201/034; B81B 2201/0292;
(Continued)

(56) References Cited

U.S. PATENT DOCUMENTS 9,658,087 B1   5/2017  Baur et al.
10,024,713 B1*  7/2018  Martin .................... G01H 11/02
(Continued)

FOREIGN PATENT DOCUMENTS

CN       105841856 A     8/2016
WO       2016/067197 A1  5/2016

OTHER PUBLICATIONS

Alfadhel et al., "Magnetic Nanocomposite Cilia Tactile Sensor," *Adv. Mater.* 27:7888-7892, 2015.
(Continued)

*Primary Examiner* — Shahed Ahmed
*Assistant Examiner* — Sun Mi Kim King
(74) *Attorney, Agent, or Firm* — Seed IP Law Group LLP

(57) ABSTRACT

A sensor comprising a support and a flexible structure arranged on the support is provided. The flexible structure comprises a frustum-shaped portion having a wider end and a narrower end, wherein the wider end of the frustum-shaped portion is arranged proximal to the support, and an elongated portion extending from the narrower end of the frustum-shaped portion, wherein the flexible structure further comprises a stretchable conducting film arranged on the frustum-shaped portion. A method of preparing such a sensor is also provided.

18 Claims, 17 Drawing Sheets

(58) Field of Classification Search
CPC ...... B81B 2203/0361; B81B 2207/053; G01L 1/205; G01L 1/2287; G01L 5/161; G01P 5/02; G01P 5/04; B82Y 15/00

See application file for complete search history.

(56) References Cited

U.S. PATENT DOCUMENTS

| | | | | |
|---|---|---|---|---|
| 2010/0136281 | A1* | 6/2010 | Sitti | A44B 18/0049 428/92 |
| 2014/0283604 | A1 | 9/2014 | Najafi et al. | |
| 2015/0338253 | A1* | 11/2015 | Kottapalli | G01P 5/04 73/861.74 |

OTHER PUBLICATIONS

Beem et al., "Exquisitely sensitive seal whisker-like sensors detect wakes at large distances," Department of Mechanical Engineering, Massachusetts Institute of Technology, Cambridge, MA, 24 pages.

Boland, "Within touch of artificial skin" *Nature Materials*:1-2, 2010.

Diao et al., "A particle transport study of vertical evaporation-driven colloidal deposition by the coffee-ring theory," *Colloids and Surfaces A: Physicochemical and Engineering Aspects* 338:167-170, 2009.

Halata et al., "Sensory Innervation of the Hairy Skin (Light- and Electronmicroscopic Study)," *J Invest Dermatol* 101(1 Supplement):75S-81S, 1993.

Harada et al., "Fully Printed, Highly Sensitive Multifunctional Artificial Electronic Whisker Arrays Integrated with Strain and Temperature Sensors," *ACS Nano* 8(4):3921-3927, 2014.

Hu et al., "Marangoni Effect Reverses Coffee-Ring Depositions," *J. Phys. Chem. B* 110(14):7090-7094, 2006.

Huang et al., "Nonlinear analyses of wrinkles in a film bonded to a compliant substrate," *Journal of the Mechanics and Physics of Solids* 53:2101-2118, 2005.

Kaplan et al., "Dynamics of evaporative colloidal patterning," pp. 1-11, 2018.

Khang et al., "Molecular Scale Buckling Mechanics in Individual Aligned Single-Wall Carbon Nanotubes on Elastomeric Substrates," *Nano Letters* 8(1):124-130, 2008.

Lee et al., "A graphene-based electrochemical device with thermoresponsive microneedles for diabetes monitoring and therapy," *Nature Nanotechnology*:1-7, 2016 (9 pages).

Lee et al., "Biomimetic Design and Fabrication of Components for Artificial Hair Cell Sensor," *IEEE*:789-792, 2009.

Liang et al., "Intrinsically stretchable and transparent thin-film transistors based on printable silver nanowires, carbon nanotubes and an elastomeric dielectric," *Nature Communications* 6:7647, 2015 (10 pages).

Liu et al., "3D-Structured Stretchable Strain Sensors for Out-of-Plane Force Detection," *Adv. Mater.* 30:1707285, 2018 (9 pages).

Liu et al., "3D-Structured Stretchable Strain Sensors for Out-of-Plane Force Detection," *Adv. Mater.* 30:1707285, 2018, (30 pages)(Supporting Information).

Liu et al., "A Stretchable and Transparent SWNT Strain Sensor Encapsulated in Thin PDMS Films," *IEEE*:1091-1094, 2013.

Liu et al., "Thickness-Gradient Films for High Gauge Factor Stretchable Strain Sensors," *Adv. Mater.* 27:6230-6237, 2015.

Maheshwari et al., "Coupling Between Precipitation and Contact-Line Dynamics: Multiring Stains and Stick-Slip Motion," *Physical Review Letters* 100:044503, 2008 (4 pages).

McEvoy et al., "Materials that couple sensing, actuation, computation, and communication," *Science* 347(6228):1261689, 2015 (10 pages).

Monteiro-Riviere, "Structure and Function of Skin," Center for Chemical Toxicology Research and Pharmacokinetics, North Caroline State University, Raleigh, North Carolina, 18 pages.

Nguyen et al., "Patterning of Small Particles by a Surfactant-Enhanced Marangoni-Bénard Instability," *Physical Review Letters* 88(16):164501, 2002 (4 pages).

Rus et al., "Design, fabrication and control of soft robots," *Nature* 521(7553):467-475, 2015 (24 pages).

Sekitani et al., "Stretchable active-matrix organic light-emitting diode display using printable elastic conductors," *Nature Materials* 8:494-499, 2009.

Shi et al., "Artificial Hair Cell Sensors Using Liquid Metal Alloy as Piezoresistors," *IEEE*:978-981, 2013.

Shmuylovich et al., "Surface Morphology of Drying Latex Films: Multiple Ring Formation," *Langmuir* 18:3441-3445, 2002.

Slinker et al., "Variable Deflection Response of Sensitive CNT-on-Fiber Artificial Hair Sensors from CNT Synthesis in High Aspect Ratio Microcavities," *Proc. of SPIE* 9429:942917, 2015 (14 pages).

Song et al., "Buckling of a stiff thin film on a compliant substrate in large deformation," *International Journal of Solids and Structures* 45:3107-3121, 2008.

Takei et al., "Highly sensitive electronic whiskers based on patterned carbon nanotube and silver nanoparticle composite films," *PNAS* 111(5):1703-1707, 2014.

Tee et al., "An electrically and mechanically self-healing composite with pressure- and flexion-sensitive properties for electronic skin applications," *Nature Nanotechnology* 7:825-832, 2012.

Tobin et al., "Hair melanocytes as neuro-endocrine sensors—Pigments for our imagination," *Molecular and Cellular Endocrinology* 243:1-11, 2005.

Tobin, "Biochemistry of human skin—our brain on the outside," *Chem. Soc. Rev.* 35:52-67, 2006 (25 pages).

Volkov et al., "Biologically Closed Electrical Circuits in Venus Flytrap," *Plant Physiology* 149:1661-1667, 2009.

Wang et al., "Configurable Resistive Switching between Memory and Threshold Characteristics for Protein-Based Devices," *Adv. Funct. Mater.* 25:3825-3831, 2015.

Wegst et al., "Bioinspired structural materials," *Nature Materials* 14:23-36, 2015.

Weon et al., "Self-Pinning by Colloids Confined at a Contact Line," *Physical Review Letters* 110:028303, 2013 (5 pages).

White et al., "Programmable and adaptive mechanics with liquid crystal polymer networks and elastomers," *Nature Materials* 14:1087-1098, 2015.

Xu et al., "Self-Assembly of Gradient Concentric Rings via Solvent Evaporation from a Capillary Bridge," *Physical Review Letters* 96:066104, 2006 (4 pages).

Yunker et al., "Suppression of the coffee-ring effect by shape-dependent capillary interactions," *Nature* 476:308-311, 2011.

Zang et al., "Sensitive Flexible Magnetic Sensors using Organic Transistors with Magnetic-Functionalized Suspended Gate Electrodes," *Adv. Mater.* 27:7979-7985, 2015.

Zarek et al., "3D Printing of Shape Memory Polymers for Flexible Electronic Devices," *Adv. Mater.* 28:4449-4454, 2016.

Zhu et al., "Microstructured Graphene Arrays for Highly Sensitive Flexible Tactile Sensors," *small* 10(18):3625-3631, 2014.

Zhu et al., "Skin-Inspired Haptic Memory Arrays with an Electrically Reconfigurable Architecture," *Adv. Mater.*:1-8, 2015.

Jaganatharaja et al, "Highly-Sensitive, Biomimetic Hair Sensor Arrays for Sensing Low-Frequency Air Flows," *Transducer Science and Technology Group* T4F.003: 1541-1544, 2009.

\* cited by examiner

FIG. 9
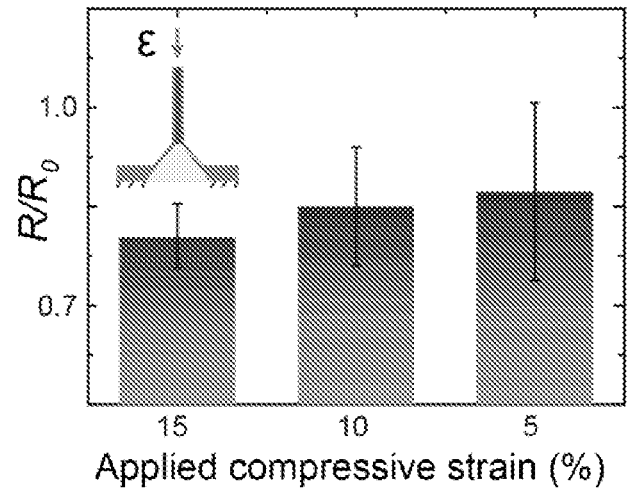
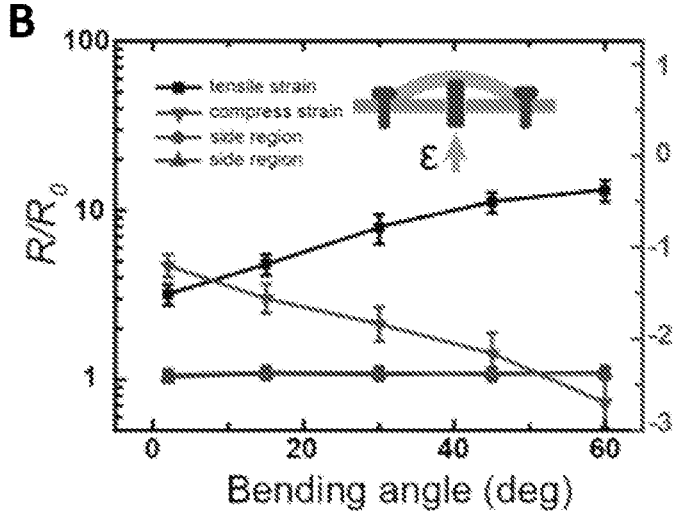
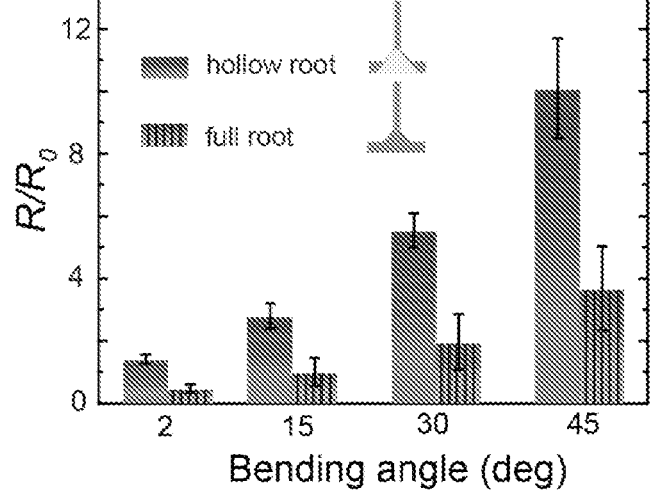

3D-STRUCTURED SENSORS HAVING STRETCHABLE MULTI-FUNCTIONAL TACTILE ELECTRONIC HAIRS

CROSS-REFERENCE TO RELATED APPLICATION

This application claims the benefit of priority of Singapore Patent Application No. 10201707830V filed on 22 Sep. 2017, the content of it being hereby incorporated by reference in its entirety for all purposes.

TECHNICAL FIELD

Various embodiments relate to a sensor comprising a support and a flexible structure arranged on the support. Various embodiments also relate to a method of preparing such a sensor.

BACKGROUND

Sensors for detecting in-plane forces have been developed based on various materials, such as metal/carbon nanomaterials, conductive polymers, liquid metal, microfludics, etc. The in-plane forces refer to forces that are applied in the plane of where the sensor is disposed, and include tensile forces that stretch the sensor. To illustrate, a flat film sensor as shown in FIG. 1A may be referred to. This flat film sensor may be used to detect the amount of force that is applied to stretch the flat film, and such forces (i.e. in-plane forces) that stretch the film are in the plane of the film. Another illustration of in-plane forces is depicted in FIG. 1B.

In contrast to flat film stretchable sensors, animals and plants in nature possess sensors with 3D structures for detecting subtle strains that arise from interactions with the environment, such as fluid flow and/or the direction of fluid flow. The interactions may exert minute forces on the animals and plants. Such forces may be termed out-of-plane forces as they result from interactions outside the plane of where the sensor is disposed, for example, see FIG. 1A and FIG. 1B. To further illustrate, various eukaryotic species, including spiders, bats, zebrafishes and even venus flytraps, have fine tactile hairs that extend from a skin surface for detecting forces and the orientation of air or water flow, and detection of such out-of-plane forces significantly enhances capability of the organisms for sensing the environment.

In another example, the human skin contains hairs that can detect someone blowing over the hairs. The 3D architecture of the hairs renders it effective for strain detection, and the body of the hair acts as a stress amplifier that transfers the external force acting on the tip of the hair to the root of the hair, where the sensing unit is safely protected beneath the skin (FIG. 1C). Such hairs also possess stretchability, which can be lifted to as high as 5 mm with a peak force of about 0.2 N (FIG. 8A). The stretchability can be vital for real applications because the hair has to accommodate large deformations induced by the sudden pulling or stretching forces.

In light of the tactile hairs in animals and plants, several sensors with electronic whiskers or cilia derived from composite materials have been developed to mimic the strain-detection function. Such sensors may be referred to as 3D strain sensors due to presence of the whiskers/cilia (i.e. electronic hairs (e-hairs)) instead of just having a flat film sensor. These sensors, however, are non-stretchable and rigid, and despite the development of such sensors, it remains a challenge to produce 3D strain sensors having enhanced sensitivity, stretchability, detection for multiple strains, and strain-direction recognition, especially for out-of-plane forces.

There is thus a need to provide for a sensor that addresses or at least alleviates one or more of the limitations mentioned above. The sensor may have one flexible structure for addressing or alleviating the one or more limitations mentioned above. There is also a need for a method of preparing such a sensor.

SUMMARY

In a first aspect, there is provided for a sensor comprising a support and a flexible structure arranged on the support, the flexible structure comprising:
a frustum-shaped portion having a wider end and a narrower end, wherein the wider end of the frustum-shaped portion is arranged proximal to the support, and
an elongated portion extending from the narrower end of the frustum-shaped portion, wherein the flexible structure further comprises a stretchable conducting film arranged on the frustum-shaped portion.

In another aspect, there is provided for a method of preparing a sensor, the method comprising:
providing a support and a flexible structure arranged on the support, the flexible structure comprising a frustum-shaped portion having a wider end and a narrower end, wherein the wider end of the frustum-shaped portion is arranged proximal to the support, and an elongated portion extending from the narrower end of the frustum-shaped portion, and
arranging a stretchable conducting film on the frustum-shaped portion of the flexible structure.

BRIEF DESCRIPTION OF THE DRAWINGS

The drawings are not necessarily to scale, emphasis instead generally being placed upon illustrating the principles of the invention. In the following description, various embodiments of the present disclosure are described with reference to the following drawings, in which:

FIG. 1B includes the sensing element for measuring the force applied. It should be emphasized that the arrows above the sensing element are intended to show the overall concept of the out-of-plane force, and the direction of the out-of-plane forces is not limited to this. For example, the forces could be inclined at an angle to the sensor plane.

FIG. 9A shows the resistance change upon application of a compression strain.

FIG. 9B shows the resistance change with different bending angles when the isotropic strain is applied as shown in the inset. The five-point encapsulation method is employed and the resistances in the four different regions are monitored.

FIG. 9C shows a comparison of the relative resistance change between the structure with hollow root and the full root. The results showed that the resistance changes more significantly in hollow root (left column) than that of a full root (right column), indicating that the strain transfer is more efficient for a hollow root.

FIG. 11A shows the normalized resistance with different bending angle in different strain regions (as demonstrated in the inset).

FIG. 13A shows a FESEM image that presents the boundary (red dash line) between the regions (iii) and (iv) of FIG. 11A. The scale bar denotes 20 μm.

FIG. 13B shows a FESEM image of the multi-rings (between red dash lines) on the sensor body under bending strain. The sensor body is rotated to make it horizontal under the FESEM. The scale bar denotes 100 μm.

FIG. 13C shows a FESEM image of the lower ring on the root (between the red dash lines). The inset illustrates a magnified view of an area beside the lower ring on the root. The scale bar denotes 100 μm.

FIG. 19A shows the 3D-structured CNT film including two CNT thick rings and the CNT thin film in between.

DETAILED DESCRIPTION

Figure 1A:
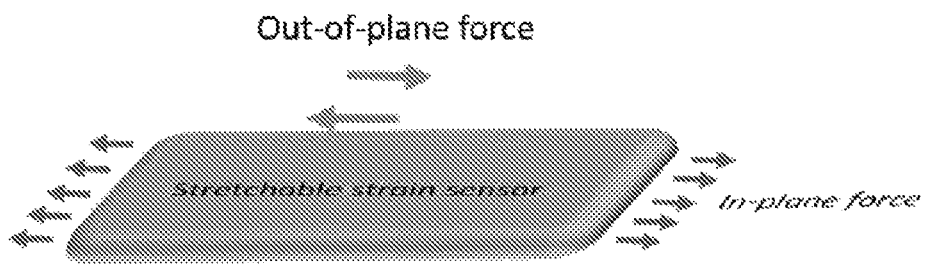
FIG. 1A shows a perspective view of the in-plane and out-of-plane forces to be detected by a stretchable strain sensor.
Figure 1B:
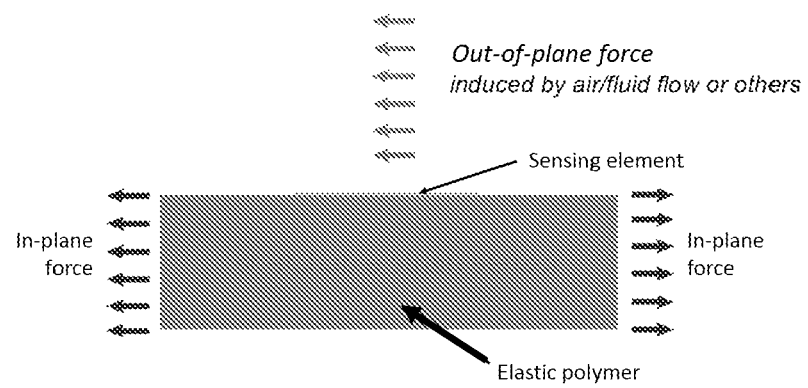
FIG. 1B shows a cross-sectional view of the in-plane and out-of-plane forces to be detected by a stretchable strain sensor.

The following detailed description refers to the accompanying drawings that show, by way of illustration, specific details and embodiments in which the invention may be practiced.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

Various embodiments disclosed herein refer to a sensor comprising a support and a flexible structure arranged on the support. Such a sensor may overcome the drawbacks of conventional sensors.

Conventional sensors have whiskers or cilia for detecting out-of-plane forces. The whiskers or cilia, however, tend to be unstretchable or too rigid to bend when out-of-plane forces are applied to, for example, the tip of the whiskers or cilia. These hinders the transfer of strain, which arises from such forces, from the tip to the base of the whiskers or cilia. A unit for measuring the force, which may be connected to the base, is then unable to measure the actual force applied and may instead produce an inaccurate measurement, rendering such conventional sensors to be poor in sensitivity.

The whiskers or cilia also suffer from the lack of ability to detect a force applied from a different direction. For example, due to the rigidity or lack of stretchability of the whiskers or cilia, they can only bend or stretch in one direction even though an out-of-plane force is applied from a different direction. In another example, the whiskers or cilia, restricted by their rigidity or lack of stretchability, are only able to accurately detect forces applied from a specific direction. Due to such limitations, conventional sensors lack the ability to recognize forces from multiple direction.

Meanwhile, the sensor as disclosed herein, advantageously provides for the detection and/or measurement of out-of-plane forces without being constrained by the limitations of conventional sensors.

Advantageously, the flexible structure that is arranged on the support of the sensor according to various embodiments disclosed herein has demonstrated improved stretchability, improved sensitivity, and detects forces applied from multiple directions. In other words, the flexible structure is able to provide for effective transfer of strain arising from a force applied to, for example, the tip of the flexible structure to the base of the flexible structure. When the strain is effectively transferred, accuracy of the force measurement is improved. The sensor according to embodiments disclosed herein is not restricted to the detection of forces applied from a specific direction, as the flexible structure is stretchable and not rigid, as compared to conventional whiskers or cilia. This means that the flexible structure is able to bend in any direction according to the direction of the force applied, and this allows for the recognition of out-of-plane forces from multiple directions. The term "flexible" as used herein refers to materials which are compliant and respond in the presence of external forces by deforming readily. For example, the flexible structure may flex or bend readily upon application of a force, and is able to return at least substantially to its original non-extended configuration after removal of the force.

To enhance stretchability and the distribution of strain arising from out-of-plane forces acting on the flexible structure, the flexible structure is configured to have a frustum-shaped portion. By the term "frustum-shaped", it includes any geometric configuration in which a cross-section dimension such as cross-section length or cross-section area increases from a first end to an opposing second end. Accordingly, the frustum-shaped portion of the flexible structure has one end surface which is larger in dimension than the other end surface, otherwise termed herein as a "wider end" or "wider end surface", and a "narrower end" or "narrower end surface", respectively. While the cross-section dimension may vary along the length of the frustum-shaped portion, the cross-section may nevertheless maintain a constant shape, such as a regular shape of a polygonal shape, a trapezoidal shape, a square, a triangular shape, an ellipse, a star-shape, or a circular shape, or an irregular shape. One example of a frustum-shaped portion may be a frusto-conical portion, which may be considered as having the shape of a cone with the cone tip truncated, and the wider end is arranged proximal to the support of the sensor. Other frustum-shaped portions, such as a frusto-polygonal, a frusto-pyrimidal, or a frusto-spherical, are further examples. A frusto-polygonal, for example, refers to a frustum-shaped portion having a polygonal cross-section. A frusto-pyrimidal refers to a pyramidal frustum-shaped portion, which may be in the form of a truncated square pyramid, or a truncated prism. A frusto-spherical refers to a hemispherical frustum-shaped portion, which may be in the form of a truncated hemisphere. By having a frustum-shaped portion as the base of the flexible structure with respect to the support, the distribution of strain that arises from a force applied onto the flexible structure can be improved, as the slope of the frustum-shaped portion is able to mitigate the sharp transition at the base where the flexible structure bends which may otherwise arise when such a frustum-shaped portion is not present. In other words, there may exist a slope gradient from one end of the frustum-shaped portion to the other end, whereby a lateral surface connecting the wider end surface and the narrower end surface of the frustum-shaped portion, and which, defines the slope gradient may be concave to, linear to, or convex with respect to a vertical axis of the frustum-shaped portion.

The frustum-shaped portion is also able to localize the strain therein rather than to distribute the strain across the entire support. In this way, the force can be effectively transmitted to a unit for measuring the force, which translates into improved accuracy of the force measurement. Without the frustum-shaped portion, the strain may not be concentrated towards the base of the flexible structure and sensitivity of the sensor may therefore be compromised.

With the above in mind, various embodiments refer in a first aspect to a sensor comprising a support and a flexible structure arranged on the support. The flexible structure comprises a frustum-shaped portion having a wider end and a narrower end, wherein the wider end of the frustum-shaped portion is arranged proximal to the support. The flexible structure also comprises an elongated portion extending from the narrower end of the frustum-shaped portion. The flexible structure further comprises a stretchable conducting film arranged on the frustum-shaped portion.

In certain embodiments, the frustum-shaped portion may be integral with the support, and may be formed using methods such as molding, 3D printing, to name only a few. Alternatively, the frustum-shaped portion may be formed separately and then assembled and attached to the support with an adhesive or by heat or solvent bonding, for example. Generally, any suitable method may be used to arrange the frustum-shaped portion on the support, while maintaining capability of the flexible structure to distribute strain within itself and to localize the strain at the frustum-shaped portion.

The dimensions of the frustum-shaped portion may be adjusted. These dimensions include the diameter of the wider end of the frustum-shaped portion, the diameter of the narrower end of the frustum-shaped portion, and/or the height of the frustum-shaped portion. As mentioned above, the wider end and the narrower end of the frustum-shaped portion is connected by a lateral surface. The respective diameter for the wider end and narrower end of the frustum-shaped portion, as well as the height of the frustum-shaped portion, may be configured so that the lateral surface connecting the wider end and the narrower end of the frustum-shaped portion has a slope gradient, so that the lateral surface forms an acute angle with respect to the wider end of the frustum-shaped portion. For example, the angle between the lateral surface and the wider end of the frustum-shaped portion may be determined by measuring the angle at which a line on the lateral surface, drawn from a point at the junction of the wider end surface and the lateral surface, forms with a line on the wider end surface drawn from the same point. The acute angle may be in the range of about 30° to about 60°, about 40° to about 50°, for example. The sensitivity of the sensor may decrease if the acute angle falls outside the range of 30° to 60°. In certain embodiments, the angle at which the lateral surface forms with the wider surface may be defined by the formula:

$$30° \leq \tan^{-1}(2H/(D_w-D_n)) \leq 60°$$

where H refers to the height of the frustum-shaped portion, $D_w$ refers to the diameter of the wider end of the frustum-shaped portion, $D_n$ refers to the diameter of the narrower end of the frustum-shaped portion. The height of the frustum-shaped portion, and the diameters of the wider and narrower ends of the frustum-shaped portion can be tailored based on the above formula, according to some embodiments.

In other embodiments, the wider end of the frustum-shaped portion may have a diameter in the range from 4 mm to 10 mm, 5 mm to 10 mm, 6 mm to 10 mm, 7 mm to 10 mm, 8 mm to 10 mm, 9 mm to 10 mm, 4 mm to 9 mm, 5 mm to 9 mm, 6 mm to 9 mm, 7 mm to 9 mm, 8 mm to 9 mm, 4 mm to 8 mm, 5 mm to 8 mm, 6 mm to 8 mm, 7 mm to 8 mm, 4 mm to 7 mm, 5 mm to 7 mm, 6 mm to 7 mm, 4 mm to 6 mm, 5 mm to 6 mm, 4 mm to 5 mm, etc.

In other embodiments, the narrower end of the frustum-shaped portion may have a diameter in the range from 1 mm to 3 mm, 1.5 mm to 3 mm, 2 mm to 3 mm, 2.5 mm to 3 mm, 1 mm to 2.5 mm, 1.5 mm to 2.5 mm, 2 mm to 2.5 mm, 1 mm to 2 mm, 1.5 mm to 2 mm, 1 mm to 1.5 mm, etc.

In other embodiments, the frustum-shaped portion may have a height in the range from 2 mm to 8 mm, 3 mm to 8 mm, 4 mm to 8 mm, 5 mm to 8 mm, 6 mm to 8 mm, 7 mm to 8 mm, 2 mm to 7 mm, 3 mm to 7 mm, 4 mm to 7 mm, 5 mm to 7 mm, 6 mm to 7 mm, 2 mm to 6 mm, 3 mm to 6 mm, 4 mm to 6 mm, 5 mm to 6 mm, 2 mm to 5 mm, 3 mm to 5 mm, 4 mm to 5 mm, 2 mm to 4 mm, 3 mm to 4 mm, 2 mm to 3 mm, etc.

In some embodiments, the frustum-shaped portion may be a hollow structure. Advantageously, when the frustum-shaped portion is hollow, the volume of solid defining the frustum-shaped portion is reduced, and may alternatively be considered to be a reduction in thickness of the wall defining the frustum-shaped portion. This may in turn allow for a higher area of strain concentration $A_\varepsilon$ at the base of the flexible structure. The area of strain concentration reflects the amount of force that is transferred to the base of the flexible structure, and with an increase in the area of strain concentration, the transfer of strain may be improved as a result. If a unit for measuring the force and/or the strain resulting from the force is disposed at the base of the flexible structure, and the force is effectively transferred, sensitivity of the sensor is also enhanced. The hollow structure of the frustum-shaped portion may have a wall thickness in the range from 300 μm to 350 μm, 310 μm to 350 μm, 320 μm to 350 μm, 330 μm to 350 μm, 340 μm to 350 μm, 300 μm to 340 μm, 310 μm to 340 μm, 320 μm to 340 μm, 330 μm to 340 μm, 300 μm to 330 μm, 310 μm to 330 μm, 320 μm to 330 μm, 300 μm to 320 μm, 310 μm to 320 μm, 300 μm to 310 μm, etc.

As mentioned above, the wider end of the frustum-shaped portion is arranged proximal to the support. By the term "proximal", it means that the wider end of the frustum-shaped portion is closer or nearer to the support, as compared to the narrower end. Depending on how the flexible structure is constructed, a portion of the frustum-shaped portion may be embedded within the support. In other words, the flexible structure arranged on the support may also include arrangements in which a portion of the flexible structure is embedded within the support. It is specified herein that only a portion of the frustum-shaped portion, such as 90%, 80%, 70%, 60%, 50%, 40%, 30%, 20% or 10%, i.e. not the entire frustum-shaped portion, is embedded within the support. This means that if the frustum-shaped portion is hollow, a portion of the frustum-shaped portion that is embedded within the support may be hollow as well. Having a portion of the frustum-shaped portion embedded allows for further adaptation that improves the transfer of an applied force from the tip of the flexible structure to its base.

As already described above, the flexible structure according to various embodiments disclosed herein has an elongated portion. The term "elongated" as used herein means that one dimension of a structure is longer over other dimensions of the structure. The longer dimension of the structure may, for example, be along a longitudinal direction of the elongated portion. One end of this elongated portion may be arranged proximal to the narrower end of the frustum-shaped portion, and the elongated portion may accordingly extend from the narrower end of the frustum-shaped portion. The elongated portion may play a part in the detection of out-of-plane forces, as it forms the part of the flexible structure that responds to a force. The elongated portion may also aid in the transfer of strain from the point at which a force is applied on the elongated portion to the frustum-shaped portion.

The aspect ratio of the elongated portion may be adjusted to improve the transfer of strain from the elongated portion to the frustum-shaped portion. The aspect ratio of the elongated portion may be adjusted also for improving its stiffness. The elongated portion may be configured to have any suitable shape so that a length along a longitudinal direction of the elongated portion is larger than other dimensions of the elongated portion. For example, the elongated portion may be a tubular portion, an ellipsoidal portion, an "S" shaped portion, or an elongated triangular prism portion. In certain embodiments, the elongated portion may comprise or be formed of a tubular portion. The tubular portion may have a diameter in the range from 1 mm to 3 mm, 1.5 mm to 3 mm, 2 mm to 3 mm, 2.5 mm to 3 mm, 1 mm to 2.5 mm, 1.5 mm to 2.5 mm, 2 μm to 2.5 mm, 1 μm to 2 mm, 1.5 mm to 2 mm, 1 mm to 1.5 mm, etc. The elongated portion may have a height in the range of 10 mm to 20 mm, 15 mm to 20 mm, 10 mm to 15 mm, etc. The elongated portion may have such lengths when it is configured to be a tubular portion or in any other elongated shapes.

The elongated portion may be configured to have a stiffness that improves the effective transfer of strain, for example, the localization of strain at the frustum-shaped portion. In this regard, the elongated portion, or the tubular portion as one example, may have a Young's modulus in the range from 1 GPa to 10 GPa, 2 GPa to 10 GPa, 3 GPa to 10 GPa, 4 GPa to 10 GPa, 5 GPa to 10 GPa, 6 GPa to 10 GPa, 7 GPa to 10 GPa, 8 GPa to 10 GPa, 9 GPa to 10 GPa, etc. The elongated portion can still transfer and/or localize the strain at the frustum-shaped portion, albeit less effectively, when the elongated portion is not configured to have a stiffness that improves transfer of strain. For example, when the elongated portion is not configured with such a stiffness and a force is applied to a part of the elongated portion, that part of the elongated portion may bend more than the other parts of the elongated portion such that the strain resulting from the applied force accumulates at the bent portion. Meanwhile, an elongated portion configured with stiffness can transfer the force to the frustum-shaped portion, and if a unit for measuring the force and/or strain is disposed at the frustum-shaped portion, a more accurate measurement can be obtained.

In various embodiments, the elongated portion may be formed of a core-shell structure to allow stiffness of the elongated portion to be customized or configured according to applications. The term "core-shell" as used herein refers to an arrangement of materials in which one of the materials envelops the other material(s). Accordingly, the term "core-shell structure" refers to a structural configuration of the elongated portion in which an external layer formed of a second material surrounds at least an outer lateral surface of the core formed of a first material, thereby forming the core-shell structure.

The elongated portion having a core-shell structure may have a core that has a Young's modulus greater than that of the shell. By having a core that is stiffer than the shell, the concentration of strain can be effectively transferred to and localized at the frustum-shaped portion. The region of the frustum-shaped portion where the strain is localized may include the narrower end and/or the wider end of the frustum-shaped portion. The advantage of having an elongated portion that is configured to have a stiffness that improves the effective transfer of strain also applies to an elongated portion having a core-shell structure where the core is configured to be stiffer than the shell. In certain embodiments, the elongated portion may comprise a tubular portion having the core-shell structure. In various embodiments, the core may have a Young's modulus in the range of 1 GPa to 10 GPa, 2 GPa to 10 GPa, 3 GPa to 10 GPa, 4 GPa to 10 GPa, 5 GPa to 10 GPa, 6 GPa to 10 GPa, 7 GPa to 10 GPa, 8 GPa to 10 GPa, 9 GPa to 10 GPa, etc. In various embodiments, the shell may have a Young's modulus in the range of 0.5 MPa to 10 MPa, 1 MPa to 10 MPa, 2 MPa to 10 MPa, 3 MPa to 10 MPa, 4 MPa to 10 MPa, 5 MPa to 10 MPa, 6 MPa to 10 MPa, 7 MPa to 10 MPa, 8 MPa to 10 MPa, 9 MPa to 10 MPa, etc.

The materials for forming the core-shell structure may be selected to improve the stiffness of the elongated portion. In various embodiments, the core may be formed of a material selected from the group consisting of polylactic acid, polyethylene terephthalate, polyethylene trimethylene terephthalate, and polyamide. Other rigid materials having a Young's modulus in the range of 1 GPa to 10 GPa and are printable may be used. In various embodiments, the shell may be formed of a material selected from the group consisting of polydimethylsiloxane and polyurethane, for example.

The dimensions of the core-shell structure may also affect the stiffness of the elongated portion as proportion of materials used for the core and the shell may differ accordingly. In various embodiments where the elongated portion is a tubular portion, the tubular portion may have a diameter in the range of 1 mm to 3 mm and the core may have a diameter that is greater than 0 mm and up to 2.8 mm, 0.8 mm to 2.8 mm, 1.5 mm to 2.8 mm, 2 mm to 2.8 mm, 2.5 mm to 2.8 mm, 1 mm to 2.5 mm, 1.5 mm to 2.5 mm, 2 mm to 2.5 mm, 1 mm to 2 mm, 1.5 mm to 2 mm, 1 mm to 1.5 mm, etc. The tubular portion may also have a diameter that is already listed above. The tubular portion may have a diameter in the range of 1 mm to 3 mm and the shell may have a thickness in the range of 100 µm to 500 µm, 150 µm to 500 µm, 200 µm to 500 µm, 250 µm to 500 µm, 300 µm to 500 µm, 350 µm to 500 µm, 400 µm to 500 µm, 450 µm to 500 µm, according to various embodiments. The tubular portion may also have a diameter that is already listed above.

According to various embodiments, the sensor, as already described above, also comprises a stretchable conducting film that may be arranged on the frustum-shaped portion for measurement of strain on the flexible structure. An entire surface of the frustum-shaped portion may be covered with the stretchable conducting film. In various embodiments, in addition to the frustum-shaped portion, at least a part of the tubular portion may be covered with the stretchable conducting film as well. A sensing unit may be connected to the stretchable conducting film for measuring the force applied. The stretchable conducting film may, for example, change its resistance when it is stretched or compressed, and the change in resistance may be converted via the sensing unit to provide an indicator for the force that is applied to result in the change in resistance.

In various embodiments, the stretchable conducting film may have a thickness in the range of 50 nm to 1000 nm, 100 nm to 1000 nm, 150 nm to 1000 nm, 200 nm to 1000 nm, 250 nm to 1000 nm, 300 nm to 1000 nm, 350 nm to 1000 nm, 400 nm to 1000 nm, 450 nm to 1000 nm, 500 nm to 1000 nm, 550 nm to 1000 nm, 600 nm to 1000 nm, 650 nm to 1000 nm, 700 nm to 1000 nm, 750 nm to 1000 nm, 800 nm to 1000 nm, 850 nm to 1000 nm, 900 nm to 1000 nm, 950 nm to 1000 nm, etc. Having a thickness of at least 50 nm may facilitate connection of the sensing unit to the stretchable conducting film.

In various embodiments, the stretchable conducting film may comprise carbon nanotubes. The carbon nanotubes may be single-walled carbon nanotubes or multi-walled carbon nanotubes. The carbon nanotubes may comprise hydrophilic functional groups, such as —COOH groups, —OH groups, and/or a combination thereof. Carbon nanotubes may advantageously be used to form the stretchable conducting film because they are able to cover an entire surface of the frustum-shaped portion, and possibly some parts of the tubular portion via a "self-pinning capillary action effect" even when the carbon nanotubes are deposited only at a surface at the wider end of the frustum-shaped portion and/or on the support abutting the frustum-shaped portion. The carbon nanotubes may, for example, be deposited in the form of a suspension onto a surface at the wider end of the frustum-shaped portion and/or on the support abutting the frustum-shaped portion. Due to capillary action, the carbon nanotubes may be drawn upwards to cover the surface of the frustum-shaped portion and possibly some parts of the tubular portion. The carbon nanotubes may be pinned to the surface of the frustum-shaped portion, or both the frustum-shaped portion and the tubular portion, hence forming the stretchable conducting film on the frustum-shaped portion, or both the frustum-shaped portion and the elongated portion. The suspension containing the carbon nanotubes may be deposited by dropping the suspension onto the surface of the frustum-shaped portion and/or the support abutting the frustum-shaped portion.

As the carbon nanotubes get drawn up the frustum-shaped portion, one or more concentric rings may be formed. In various embodiments, the carbon nanotubes may further define one or more concentric rings on the frustum-shaped portion and/or on the support abutting the frustum-shaped portion. Apart from carbon nanotubes, other conductive materials that can be dispersed in water and able to form such concentric rings may be used.

The sensing unit, as already described above, may be connected to one or more of these concentric rings for measuring the force applied. The concentric ring may have a certain thickness to facilitate connecting of the sensing unit. In various embodiments, the one or more concentric rings may have a thickness in the range of 200 nm to 1000 nm, 250 nm to 1000 nm, 300 nm to 1000 nm, 350 nm to 1000 nm, 400 nm to 1000 nm, 450 nm to 1000 nm, 500 nm to 1000 nm, 550 nm to 1000 nm, 600 nm to 1000 nm, 650 nm to 1000 nm, 700 nm to 1000 nm, 750 nm to 1000 nm, 800 nm to 1000 nm, 850 nm to 1000 nm, 900 nm to 1000 nm, 950 nm to 1000 nm, etc. In various embodiments, the sensor may further comprise a unit for measuring a force applied on the flexible structure of the sensor.

In some embodiments, the sensor may have more than one flexible structure. According to these embodiments, a plurality of the flexible structures may be arranged on the support. In certain embodiments, the plurality of flexible structures may be arranged on the support as an array. The plurality of flexible structures may also be organized in any manner on the support as long as the flexible structures are not obstructed from bending or do not get entangled with one another.

Various embodiments also refer in another aspect to a method of preparing a sensor, the method comprising providing a support and a flexible structure arranged on the support, the flexible structure comprising a frustum-shaped portion having a wider end and a narrower end, wherein the wider end of the frustum-shaped portion is arranged proximal to the support, and an elongated portion extending from the narrower end of the frustum-shaped portion, and arranging a stretchable conducting film on the frustum-shaped portion of the flexible structure. Advantages associated with various embodiments of the present sensor as described above may be applicable to the present method, and vice versa.

According to various embodiments, the providing of the support and the flexible structure comprises providing a template structure for deriving the flexible structure, or for deriving the support and the flexible structure, and disposing a polymeric solution onto the template structure. In other words, the template structure may define the shape of the flexible structure, or the shape of the support and the flexible structure disclosed herein, the flexible structure having a frustum-shaped portion having a wider end and a narrower end, and an elongated portion extending from the narrower end of the frustum-shaped portion. By disposing a polymeric solution onto the template structure, the polymeric solution may assume the shape of the template structure, and in turn, the shape of the flexible structure, or the support and the flexible structure disclosed herein. In some embodiments, the template structure defines both the flexible structure and the support, i.e. the flexible structure and the support are integrally formed. The present method is versatile in that the template structure for deriving the flexible structure, or for deriving both the flexible structure and the support can be formed integrally or as separate components for subsequent assembly and/or attachment. This may be carried out in a relatively easy manner via 3D printing. According to some embodiments, providing the template structure may be carried out by 3D printing a printable polymer. Suitable printable polymers include, but are not limited to, polylactic acid, polyethylene terephthalate, polyethylene trimethylene terephthalate, polyamide, etc. Other rigid materials having a Young's modulus in the range of 1 GPa to 10 GPa and are printable may be used.

After the template structure for deriving the flexible structure, or for deriving the support and the flexible structure, is derived, the polymeric solution may be disposed onto the template structure. The disposing of the polymeric solution onto the template structure may comprise preparing the polymeric solution by mixing a polymer and a cross-linking agent in a suitable solvent. The term "cross-link" as used herein refers to an interconnection between polymer chains via chemical bonding, such as covalent bonding. Accordingly, the term "cross-linking agent" refers to an agent which induces cross-linking. The cross-linking agent may be any agent that is capable of inducing a chemical bond between adjacent polymeric chains.

In various embodiments, the weight ratio of the polymer to the cross-linking agent may be in the range of 10:1 to 20:1, 11:1 to 20:1, 12:1 to 20:1, 13:1 to 20:1, 14:1 to 20:1, 15:1 to 20:1, 16:1 to 20:1, 17:1 to 20:1, 18:1 to 20:1, 19:1 to 20:1, etc. In various embodiments, the polymer may be selected from the group consisting of polydimethylsiloxane and polyurethane, for example.

In various embodiments, disposing the polymeric solution onto the template structure may further comprise curing the polymeric solution on the template structure for at least 3 hours to obtain a cross-linked polymer. The cross-linked polymer thus formed may assume or adopt the shape of the underlying template structure.

In various embodiments, the method may further comprise separating the flexible structure, or the support and the flexible structure, from the template structure. The separation may be carried out by peeling off the flexible structure, or the support and the flexible structure, from the template structure. Accordingly, the cross-linked polymer may be removed from the template structure to obtain the flexible structure, or to obtain the support and the flexible structure disclosed herein.

Separating the flexible structure, or the support and the flexible structure from the template structure, may be carried out in such a way that the elongated portion of the template structure is also removed. As mentioned above, the elongated portion of the flexible structure may have a core-shell structure. Accordingly, the cross-linked polymer may form a shell of the elongated portion, while the printable polymer of the template structure may form a core of the elongated portion. Comparing the printable polymer and the cross-linked polymer, the printable polymer may have a Young's modulus that is greater than that of the cross-linked polymer. The core of the elongated portion may be formed from the printable polymer while the shell of the elongated portion may be formed from the cross-linked polymer. The method may thus provides for a configuration that enhances the stiffness of the elongated portion, and this may in turn control the effective transfer of strain of the flexible structure. As mentioned earlier, the elongated portion may be a tubular portion.

In various embodiments, the frustum-shaped portion is a hollow structure, and a portion of the frustum-shaped portion may be embedded within the support. As already described above, the advantage of having a hollow structure reduces the thickness of the wall defining the frustum-shaped portion. This in turn allows for higher area for concentration of strain at the base of the flexible structure, and the transfer of strain is improved.

Once the support and flexible structure are formed, they may be treated to render them hydrophilic for subsequent coating of a stretchable conducting film. Embodiments and advantages of the stretchable conducting film have already been described above. In some embodiments, providing the support and the flexible structure may comprise subjecting the support and the flexible structure to oxygen plasma to render a surface of the support and the flexible structure hydrophilic.

By rendering the surface of the support and the flexible structure hydrophilic, the stretchable conducting film can be arranged onto the support and/or the flexible structure. In various embodiments, the arranging of the stretchable conducting film on the frustum-shaped portion of the flexible structure may comprise arranging the stretchable conducting film in the form of one or more concentric rings on the frustum-shaped portion and/or on the support abutting the frustum-shaped portion. A sensing unit may be connected to the stretchable conducting film for measuring the force applied. In various embodiments, the method may further comprise connecting the sensor to a unit for measuring a force applied to the flexible structure.

To form the one or more concentric rings, arranging the stretchable conducting film on the frustum-shaped portion of the flexible structure may comprise disposing a suspension comprising the stretchable conducting film material on the frustum-shaped portion and/or on the support abutting the frustum-shaped portion. Mechanism as to how the one or more concentric rings may be formed have already been discussed above. In various embodiments, the suspension comprising the stretchable conducting film material may comprise carbon nanotubes, or other conductive materials that can be dispersed in water and able to form the concentric rings. The suspension containing the carbon nanotubes may be deposited by dropping the suspension onto the surface of the frustum-shaped portion and/or the support abutting the frustum-shaped portion. The carbon nanotubes may be single-walled carbon nanotubes or multi-walled carbon nanotubes. The carbon nanotubes may comprise hydrophilic functional groups, such as —COOH groups, —OH groups, and/or a combination thereof.

The invention has been described broadly and generically herein. Each of the narrower species and subgeneric groupings falling within the generic disclosure also form part of the invention. This includes the generic description of the invention with a proviso or negative limitation removing any subject matter from the genus, regardless of whether or not the excised material is specifically recited herein.

Unless specified otherwise, the terms "comprising" and "comprise", and grammatical variants thereof, are intended to represent "open" or "inclusive" language such that they include recited elements but also permit inclusion of additional, unrecited elements.

In the context of various embodiments, the term "about" or "approximately" as applied to a numeric value encompasses the exact value and a reasonable variance.

As used herein, the term "and/or" includes any and all combinations of one or more of the associated listed items.

The word "substantially" does not exclude "completely" e.g. a composition which is "substantially free" from Y may be completely free from Y. Where necessary, the word "substantially" may be omitted from the definition of the invention.

In the context of various embodiments, the articles "a", "an" and "the" as used with regard to a feature or element include a reference to one or more of the features or elements.

Advantages associated with various embodiments of the present device as described above may be applicable to the present method, and vice versa.

Other embodiments are within the following claims and non-limiting examples. In addition, where features or aspects of the invention are described in terms of Markush groups, those skilled in the art will recognize that the invention is also thereby described in terms of any individual member or subgroup of members of the Markush group.

EXAMPLES

Various embodiments disclosed herein refer to a sensor comprising a support and a flexible structure arranged on the support. Various embodiments disclosed herein also refer to a method of preparing such a sensor.

The present sensor and its uses, and the present method of preparing such a sensor, are described by way of non-limiting examples, as set forth below.

Example 1A: Experimental Method—Preparation of Template and Stiffener

The template was 3D printed using Ultimaker 2 with a nozzle diameter of 0.4 mm and the printed polymer was polylactic acid (PLA). The rigid part of PLA (about 15 mm in length) with a tensile modulus of 3.5 GPa was taken as the stiffener inside the sensor body (flexible structure). In order to make the sensor hollow, the template had a cone-shaped root with a diameter of 7 mm for the base circle and height of 5 mm.

Example 1B: Experimental Method—Preparation of 3D-Structured Stretchable Strain Sensor The polydimethylsiloxane (PDMS), purchased from Sigma-Aldrich, was employed as the soft substrate. The prepolymer and the cross linker were mixed together in a ratio of 10:1 by weight, and then defoamed by vacuum for about half of an hour, and finally dropped onto the template fully. Spin coating at 500 rpm for 60 s and curing at 60° C. for 6 hrs were carried out. The thickness of the PDMS film was about 320 μm. The single-walled carbon nanotubes (SWCNTs) modified with hydrophilic functional group of carboxylic acid was from Carbon Solution, Inc. It was dispersed in deionized water in an ultrasound water bath. The power was 200 W for about 2 hrs (Fisher Scientific FB15051). The SWCNTs with a concentration of 2 g $L^{-1}$ was well dispersed in the solution and ready to be used after about 15 mins of standing for the subsiding of the large aggregates.

Next, the gradient root (frusto-conical portion) of the sensor was exposed to oxygen plasma to become hydrophilic by using a covering mask with circled hollow pattern to limit the hydrophilic area. The oxygen pressure was 5 mbar with power of 50 W for 0.5 mins. After removing the hollow mask, 10 μL of SWCNT suspension was dropped on the gradient root and immediately covered the pattern, even climbing up the flexible structure to a height of about 2 mm under the assistance of capillary force. After evaporation for about 30 mins in the air at room temperature, the 3D self-pinning effect ended. Finally, the sensor was separated from the PLA substrate with the stick (elongated portion) left inside the sensor body, and the 3D-structured stretchable strain sensor was ready to be tested after careful encapsulation. The elongated portion in this example was a tubular portion. The sensor array was also prepared via the present method. However, the wire bonding was more complicated and was carried out among the sensors based on a pattern of crossing bar.

Example 1C: Experimental Method—Preparation of PDMS Composite Film with CNT For Comparison Multi-wall CNT powder (Timesnano, Chengdu, China) with 30-50 nm in diameter and 10-20 μm in length were dispersed in toluene at an 8 wt % concentration in sonicated bath. PDMS monomer was added to the mixture followed by mixing and the cross linker was added after the toluene completely evaporated. Air bubbles were then removed by vacuum. Finally, the mixture was poured to the petri dish and cured for more than 2 days at room temperature.

Example 1D: Experimental Method—Wire Bonding and Dynamic Resistance Testing Under Cyclic Loading The bonding copper wires, with a diameter of 0.1 mm, were used to make the compliant contact with the SWCNTs rings (FIG. 9A to FIG. 9C). The liquid metal (Gallium-Indium eutectic, Sigma-Aldrich) served as the conductive adhesive for hugely improving the stability of this encapsulation, especially benefitting the dynamic resistance testing. It is emphasized that wires were all shaped in an arc to maintain continuous contact during the cyclic loading.

Example 1E: Characterization

A load cell of 500 N was used to test the tensile force of the real hair on the forearm of an asian male adult by employing mechanical tester MTS C43. The tensile speed was 1 mm/min. The cyclic bending strain was also applied by using the same machine and a customized transducer to change the vertical displacement to rotation. Field emission scanning electron microscopy was performed using JEOL 7600F with the accelerating voltage of 5 kV and the current of 110 pA. The resistance was measured by using Keithley 4200-SCS with the sampling rate of 125 points per second.

For the detection of fluid (e.g. gas and/or water) flow, nitrogen flow of different speeds were employed. The double faced adhesive tape was used to modify the head of the sensor body to enhance the gas pressure sensing. A gas gun was opened first, nitrogen was applied for about 1 second, and then removed. The sensor would suffer the damping vibration process before reaching the static state. A rubber tube with diameter of 5 mm was utilized to tune the different flow state by adjusting the tap pressure. Additionally, Reynolds number is the standard dimensionless number reflecting the flow state, and when it is larger than 4000, the flow state is usually taken as turbulence.

Example 2: Electronic Hairs Design Based on Structural Mechanics

For out-of-plane force detection, a key issue is to ensure efficient transduction of the force from the top of the hair sensor to the root, where the sensing unit is disposed and protected, to obtain a high sensitivity. If the strain on the hair sensor could not be properly transferred, the sensing performance becomes worse. Therefore, the strain concentration at the root ($\varepsilon_c$) and the area of strain concentration ($A_\varepsilon$) should be looked into. Examples of the strain may include, but not limited to, tensile strain and/or compression strain. Based on this, four models of sensors with increasing complexity in terms of their 3D architecture were derived, and the models are represented by structures I to IV in FIG. 2A. The strain concentration and distribution for each model were determined through finite element modeling (FEM) simulation. This approach was used to identify the features of the 3D-structured stretchable strain sensor that contribute to signal amplification and transmission, and to define the 3D design for strain detection.

Figure 2A:
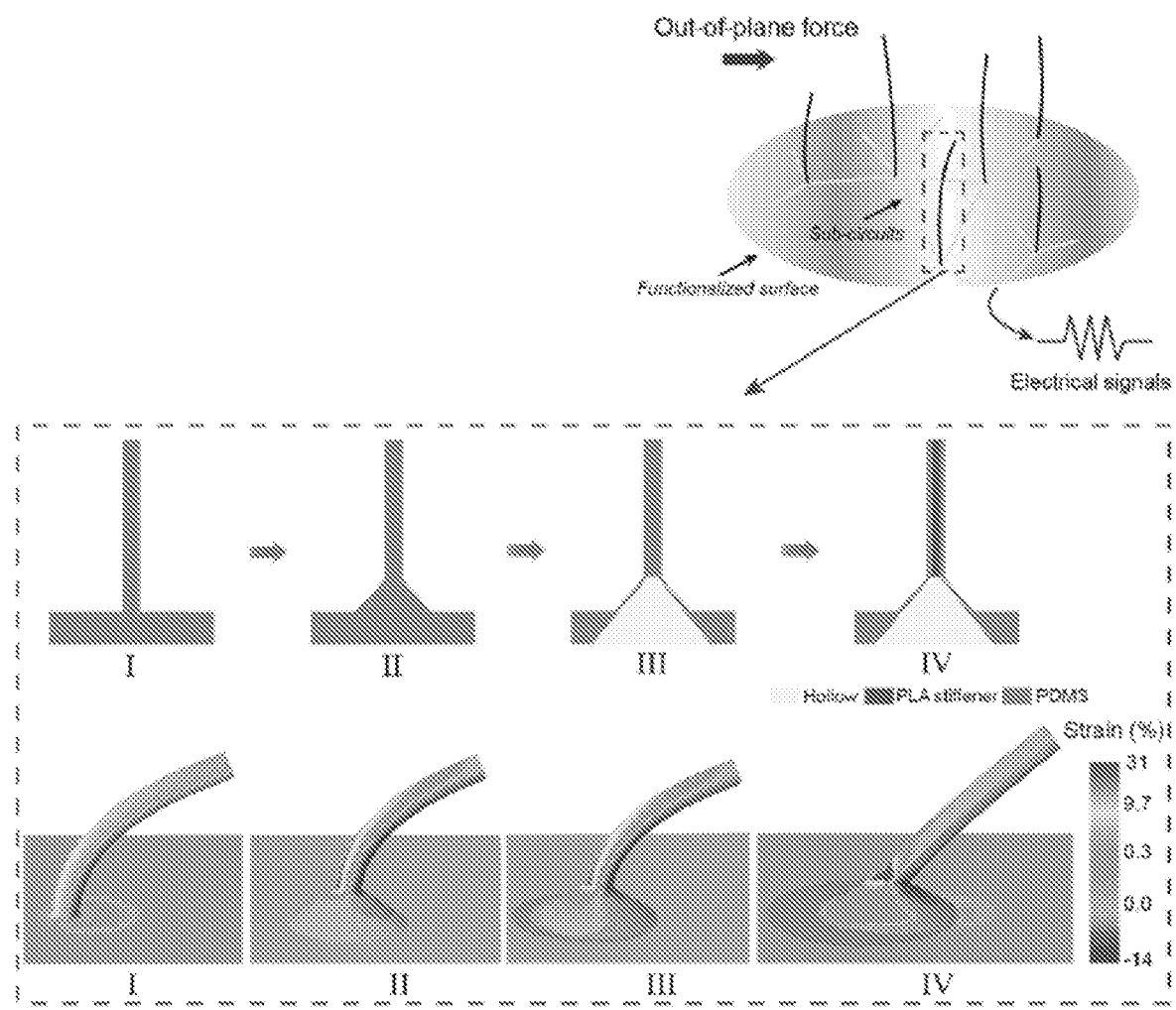
FIG. 2A shows the mechanical models of 3D-structure stretchable strain sensors. Specifically, the top figure in FIG. 2A shows the concept that the sensor could be intergrated with subcircuits and have a functionalized surface, such as a soft robotic skin, to detect out-of-plane forces. The boxed-up figure shows the four structures (I, II, III, IV) which have been derived from a three-step mechanical design based on energy conservation and classical bending moment theory. In the upper row of the boxed-up figure, the structure IV has two parts: a hair body with a stiffener of polylactic acid (PLA), and a hollow root. The lower row in the boxed-up figure illustrates strain concentration and strain distribution under a bending angle of 45° as calculated by finite element modeling (FEM) simulation for the four different structures. Negative value reflects compression.
Figure 2B:
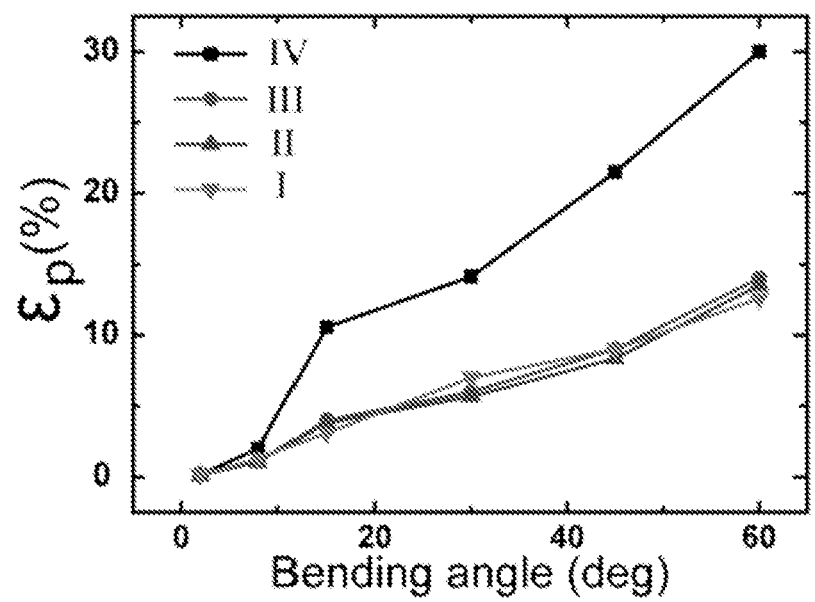
FIG. 2B shows a plot of the strain concentration for the four different structures in FIG. 2A under different bending angles.
Figure 2C:
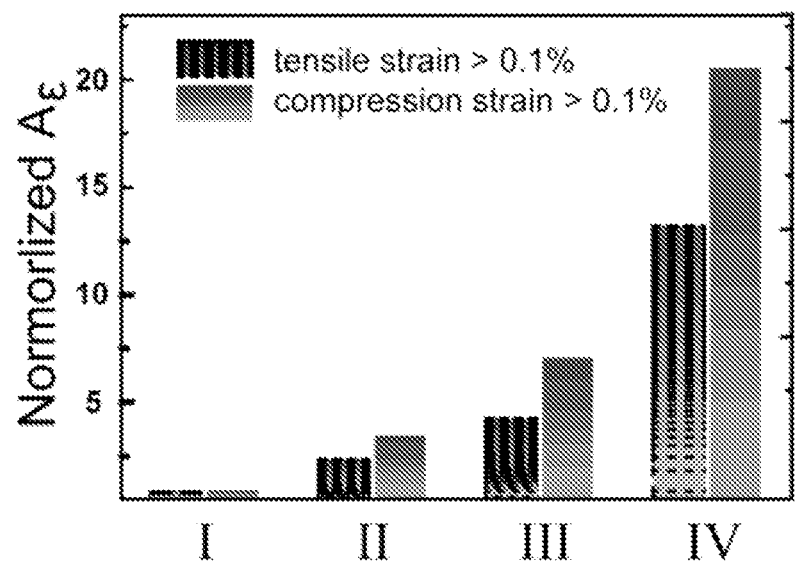
FIG. 2C shows a plot of the strain distribution areas (more than 0.1%) for the four structures in FIG. 2A under a bending angle of 45°.
Figure 2D:
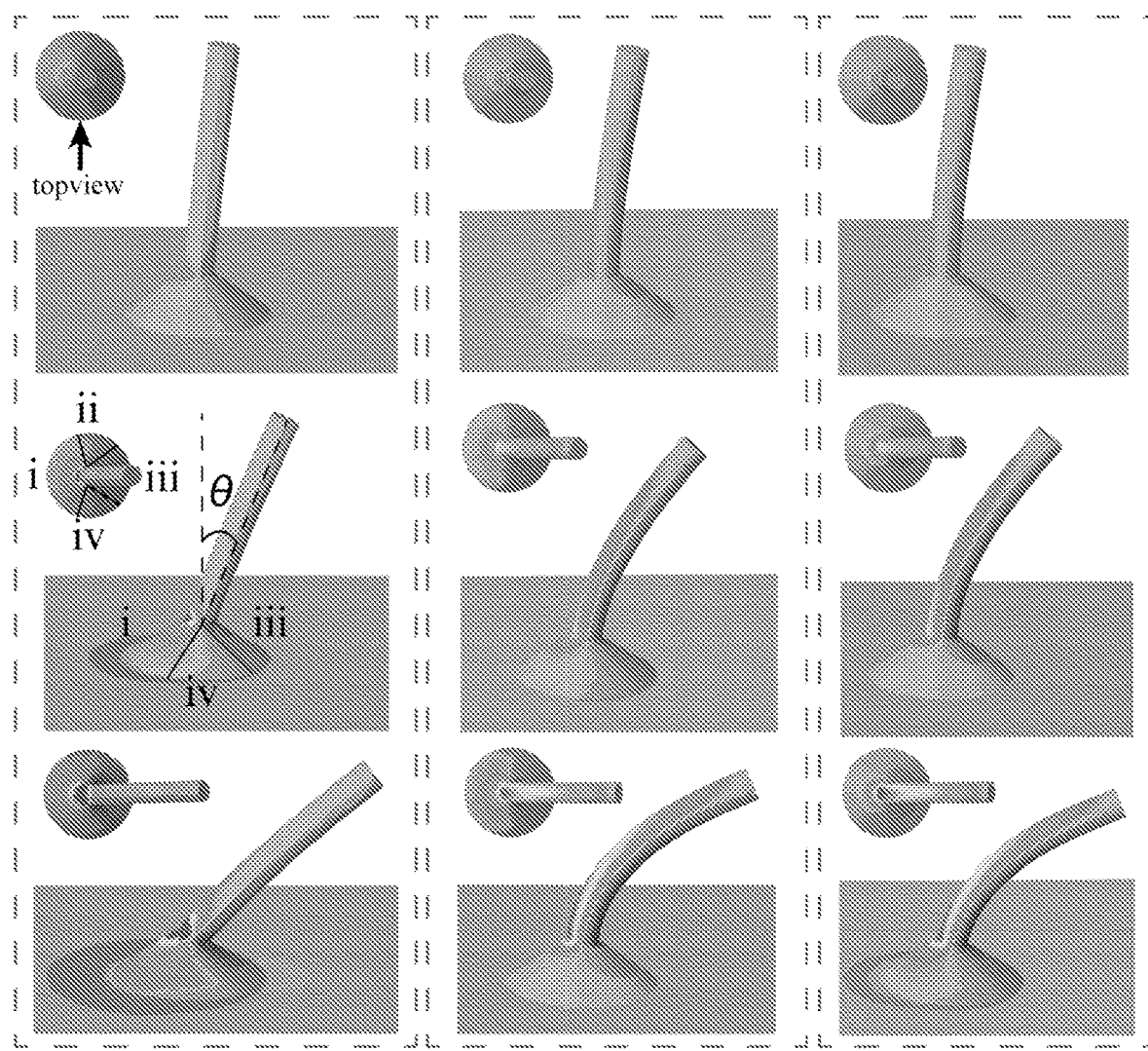
FIG. 2D shows the FEM simulation for strain distribution of different sensor structures. The left column shows the top view (top left inset of each image) and the side view of a sensor having a hollow substrate and a stiffener inside the sensor body. The center column shows the top view (top left inset of each image) and the side view of a sensor having a hollow substrate without the stiffener. The right column shows the top view (top left inset of each image) and the side view of a sensor having a non-hollow substrate.

For the most basic structure (FIG. 2A, structure I), the sensor body was directly inserted into the elastic substrate and the whole substrate acted as a strain buffer zone that assists in absorbing the strain energy. For structure I, the strain was much less concentrated at the root where it was expected to induce significant local changes in both $\varepsilon_c$ and $A_\varepsilon$ (FIG. 2A to FIG. 2C). In other words, structure I helps to improve the transfer of strain from the tip to the root, and the strain is confined to a larger region of the frustum-shaped portion. This limits the sensitivity of the 3D-structured stretchable strain sensor. The overall distribution volume of the strain was then tuned by introducing a gradient transition region between the sensor body and the elastic substrate (FIG. 2A, structure II). Such a region was beneficial in terms of avoiding sharp transitions. It also localized the strain at the frusto-conical portion rather than distributing it across the entire support or substrate. According to the classical formula of strain energy, a relationship between the external work, W, and the inner deformation energy can be written as:

$$W = \tfrac{1}{2} E \int_V \varepsilon^2 dV$$

where E is the Young's modulus, $\varepsilon$ is the strain induced, and V is the volume. By applying the mean-value theorem of integrals, this expression can be rewritten as:

$$W = \tfrac{1}{2} E \bar{\varepsilon}^2 A_\varepsilon \bar{h}$$

where $\bar{\varepsilon}$ is the mid value (i.e. average strain of the flexible structure), and $\bar{h}$ is the average thickness. Thus, for a given external work applied, $A_\varepsilon$ can be maximized by relatively reducing the wall thickness of the volume, for example, by hollowing the gradient transition region (FIG. 2A, structure III). The FEM showed that although $A_\varepsilon$ increased significantly by this two-step design (FIG. 2C), $\varepsilon_c$ did not increase for structures I to III (FIG. 2B). In light of this, the classical theory of bending moment was revisited. According to this theory, the 3D-structured sensor can be simplified as an ideal beam, and the force acting on the root can be expressed as: $F = 3EI\gamma/l^3$, where $\gamma$ is the deflection, E is the Young's modulus, l is the length of the sensor, and I is the moment of inertia. Thus, $\varepsilon_c \approx 3EI\gamma/l^3$ and then, for a specific sensor with a given length and applied $\gamma_{max}$, $\varepsilon_c$ was determined by the stiffness, EI. The issue was how to enhance the stiffness of the sensor. In structure IV, a coaxial composite was used to increase the stiffness (Young's modulus) of the core. Thus, by replacing the core with a stiffer polymer, e.g. polylactic acid (PLA), whose modulus was larger than that of the surrounding soft polymer (e.g. polydimethylsiloxane), the stiffness would be increased and $\varepsilon_c$ was enhanced (FIG. 2A, structure IV). After considerations of the designs as described above, the strain energy transfers from the top of the hair to its bottom was improved, and both $A_\varepsilon$ and $\varepsilon_c$ were enhanced (FIG. 2B, FIG. 2C and FIG. 2D). It should be emphasized, however, that further improvements can be made to advance the performance of this 3D-structured stretchable strain sensor, for example, by adjusting the shape of the conic root and modulus of the stiffener.

Example 3A: Fabrication of Stretchable 3D-Structured Electronic Hairs

Having established the various structures for detection of strain and given that the 3D hair structure could be fabricated by 3D printing, the challenge turns to how a stretchable conducting film for strain measurement could be deposited on such a 3D-structure. For accurate monitoring of strain concentration at the hair root, the stretchable conducting film has to completely cover the gradient root region and part of the sensor body. One possible material is to use single-wall carbon nanotubes (SWCNTs) modified with carboxyl groups, which could form a SWCNTs thin film fully covering the flat substrate by a self-pinning approach. The surface of the frustum-shaped portion and/or the surface of the support abutting the frustum-shaped portion may be hydroxylated for improved adhesion of the carbon nanotubes other than modifying the carbon nanotubes.

Figure 3:
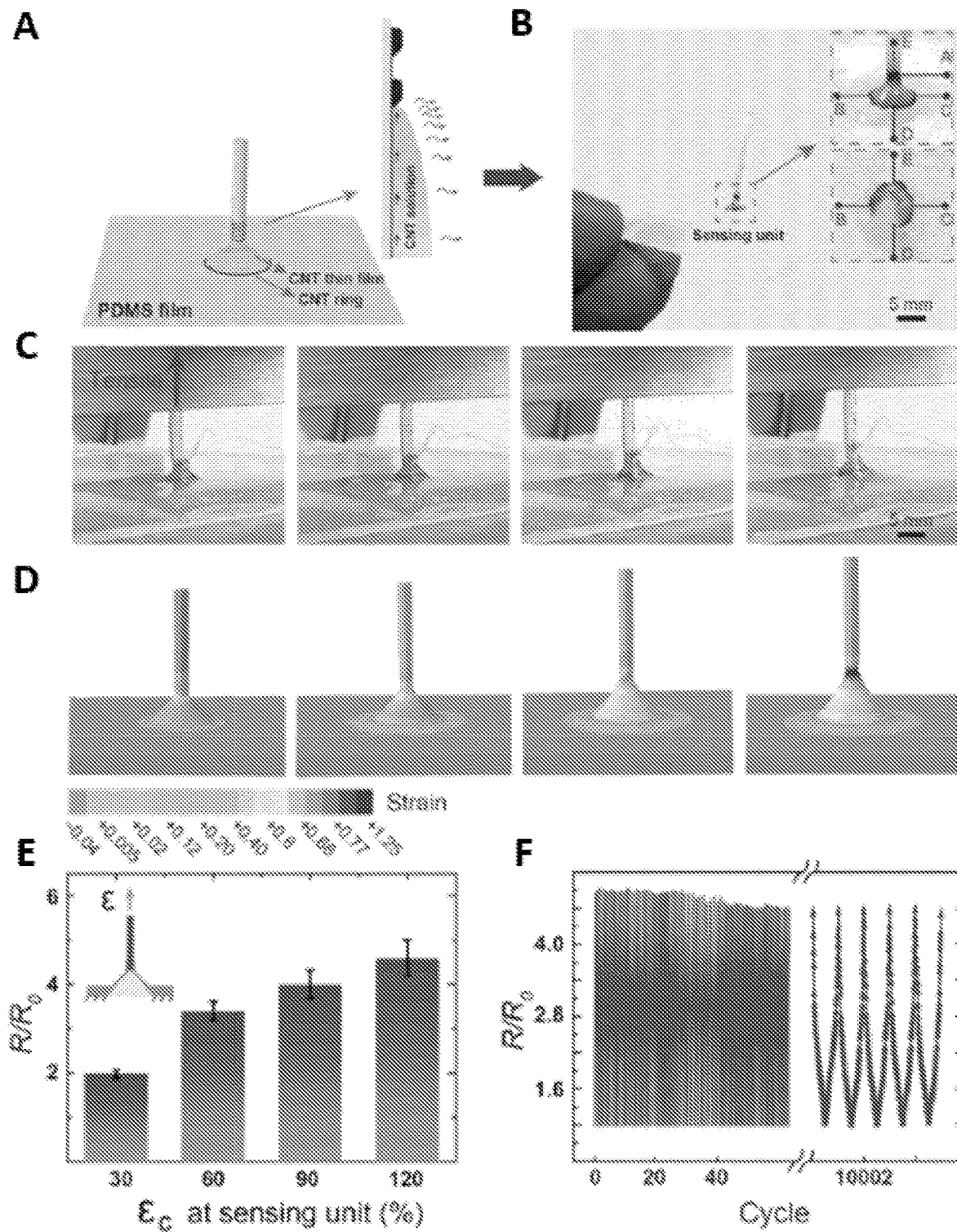
FIG. 3A shows a diagram of the self-pinning effect for the formation of the multi-rings and carbon nanotube (CNT) thin film on the flexible structure (sensor body) that extends from a support.
FIG. 3B shows an image of a fabricated 3D-structured stretchable strain sensor. The two insets illustrate the five-point encapsulation method. The scale bar denotes 5 mm.
FIG. 3C shows the optical images of the sensor during stretching. The scale bar denotes 5 mm.
FIG. 3D shows the corresponding strain distribution of FIG. 3C by the FEM method.
FIG. 3E shows the resistance change with different strain concentration applied to the sensing unit. Normalized resistance, $R/R_0$, where R and $R_0$ are the resistance values monitored with and without applied strain, respectively. The inset shows how the strain is applied.
FIG. 3F shows the durability of the sensor under tensile strain. A tensile strain of 120% at the sensing unit was applied for over 10,000 strain cycles.
FIG. 3G shows a flow diagram of 3D-structured stretchable strain sensor fabrication. The flow diagram starts with a 3D printed mould made with polylactic acid (PLA). A polydimethylsiloxane (PDMS) film is coated on it, followed by separation of the substrate from the PDMS film having the stiffener. Partial hydrophilization is carried out using oxygen plasma. CNT suspension is dropped on, covering the whole root and part of the sensor body under the help of capillary force, and multi-rings form on the sensor body and root by self-pinning effect.
Figure 3:
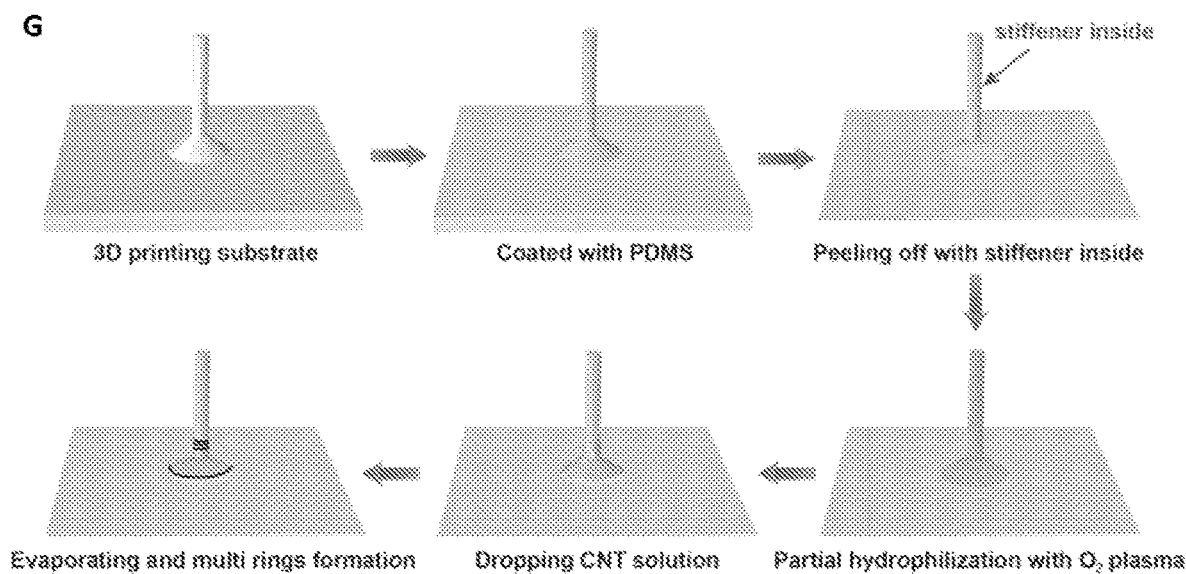
Figure 4:
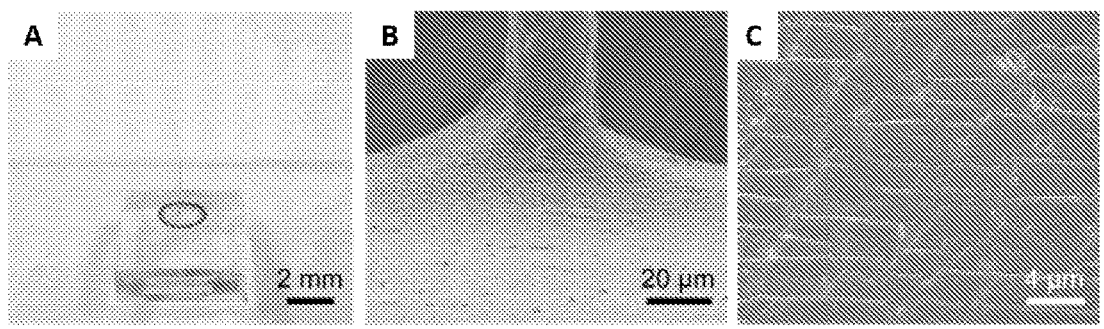
FIG. 4A shows a sensor fabricated with a sensor-body diameter of about 25 μm, specifically showing how fine the sensor body is. The scale bar denotes 2 mm.
FIG. 4B shows a field emission scanning electron microscopic (FESEM) image of the gradient root. The scale bar denotes 20 μm.
FIG. 4C shows typical cracks and wrinkles at the structure on the root. The scale bar denotes 4 μm.
Figure 7:
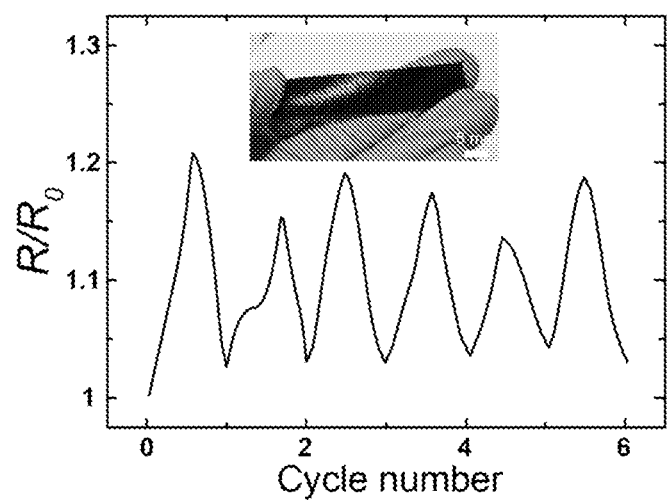
FIG. 7 shows the resistance change of a PDMS composite film with CNTs. The inset illustrates the optical image of an as-prepared sensor. The cyclic tensile strain of 30% was applied to the sensor. The initial resistance was about 16 kΩ while the initial resistance of the CNT ring was around 3 kΩ. The resistance change was quite small for the composite film.

In the present method, not only was the self-pinning approach utilized, but a capillary force mediated approach was also used for self-pinning of SWCNTs in the out-of-plane direction (FIG. 3A). Specifically, after constructing the hair structure through 3D printing, the SWCNTs suspension was deposited at the root and allowed to climb the sensor body (height of around 2 mm) through capillary action during which the self-pinning effect enabled the formation of an out-of-plane SWCNTs film (FIG. 3G). A unique feature of the present method was that SWCNTs did not only form ring structure on the outside, but also fully covered the region between the rings with a thin film (FIG. 3B). The present method was also suitable for deposition on thin microwire of diameter up to about 25 µm (FIG. 4A to FIG. 4C) and could be applied to other polymer substrates, for example, Ecoflex. Moreover, it was also found that multiple rings were formed on the sensor body (FIG. 3A, FIG. 5A, FIGS. 6A and 6B, also see examples 3B and 3C). Two major non-coplanar ring regions can be observed: one at the bottom of the sensor root and another one on the body, which can be used as connection points in an encapsulation and testing process (FIG. 3B). In order to demonstrate the advantage of the present capillary force mediated self-pinning method, a PDMS composite film comprising CNTs homogeneously dispersed in the PDMS was prepared. The sensing performance was tested (FIG. 7). The results showed that the resistance change is much smaller (only ≈18%) and the repeatability is also poor for the composite film. Hence, for depositing CNTs onto the substrate, the present approach of capillary force mediated self-pinning is advantageous over the approach based on depositing a composite film already having CNTs on the substrate.

Example 3B: 3D Self-Pinning Effect For Making Multi-Rings on Sensor Body

Figure 5:
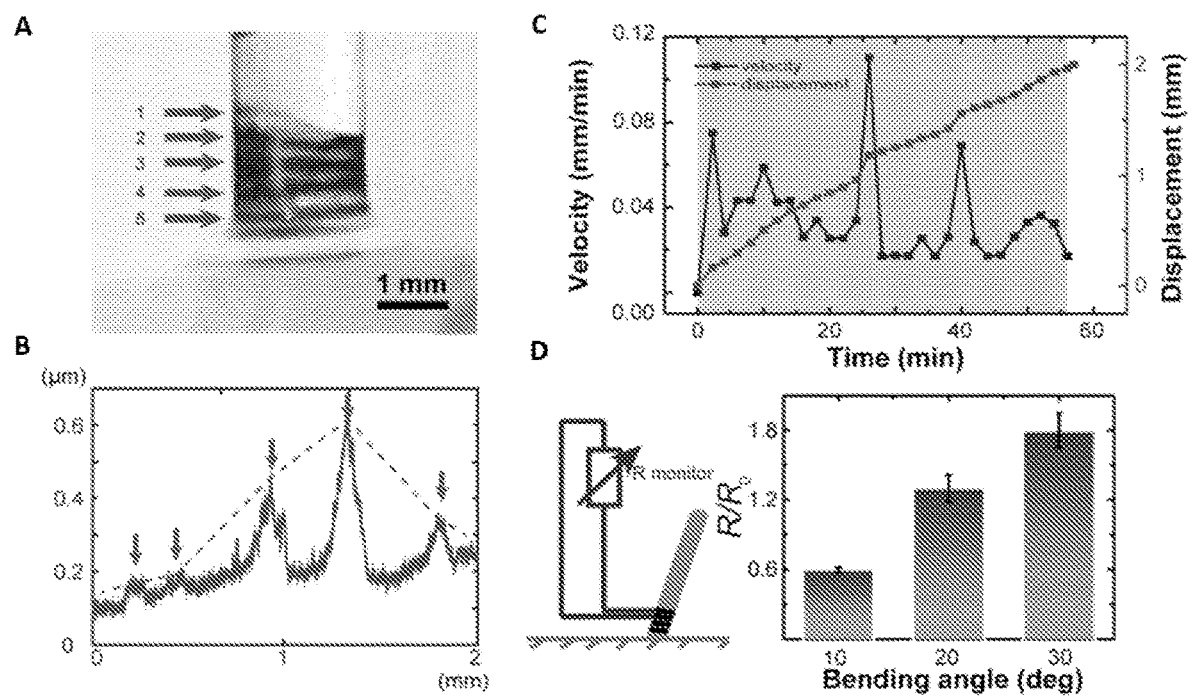
FIG. 5A shows an image of five rings on the sensor body. The scale bar denotes 1 mm.
FIG. 5B shows the surface profile data of the five rings of FIG. 5A.
FIG. 5C shows a plot of the velocity and displacement monitored by a high-speed camera.
FIG. 5D shows that the multi-rings can be employed to test the detailed deformation on the sensor by careful encapsulation.
Figure 6:
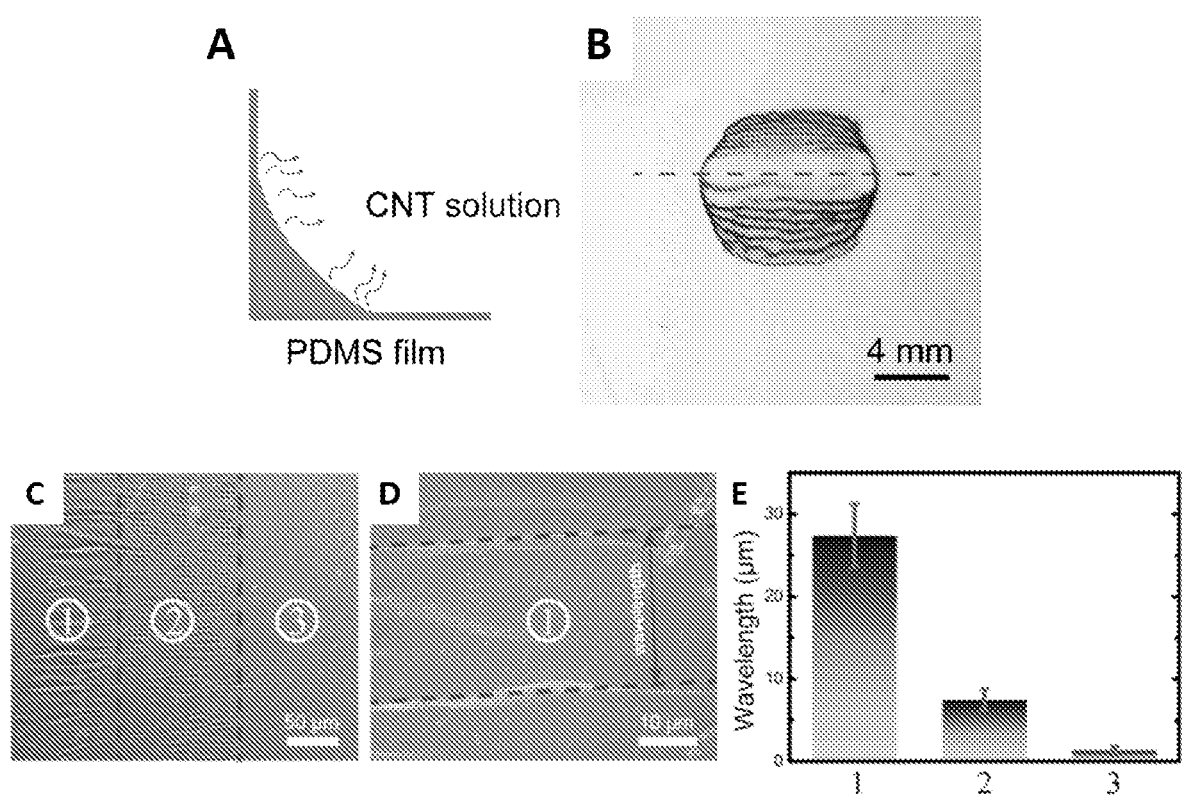
FIG. 6A shows a diagram of the multi-ring formation. The PDMS substrate is folded, made hydrophilic, and SWCNT suspension was added at the folded corner.
FIG. 6B shows an image of the fabricated multi-ring SWCNTs film. The dashed line depicts the central line of the corner. The scale bar denotes 4 mm.
FIG. 6C shows the thickness-gradient of the SWCNTs film on the sensor body. The sensor is rotated such that the upper ring becomes horizontal under FESEM. The film can be roughly divided into three regions: thick ring part ①, transitional part ② and inner thin part ③, according to the wavelength of the wrinkle that corresponds to the thickness of the film. The scale bar denotes 50 μm.
FIG. 6D shows the detailed observation of the thick ring part in FIG. 6C and the definition of the wavelength. The scale bar denotes 10 μm.
FIG. 6E shows the change in wavelength for different regions.

During the 3D self-pinning process, it is observed that there were multiple rings from the thickness profile data (FIGS. 5A and 5B) on the sensor body after evaporation of the SWCNT suspension, indicating that the self-pinning process was not continuous but more like a jumping one. To fully understand the mechanism, the evaporation and how high up the carbon nanotubes travel on the flexible structure were monitored by using a high speed camera and the dropping of liquid level was tracked. The liquid level that was tracked in this instance refers to the level of the deposited carbon nanotube suspension on the flexible structure, which includes the tubular portion and the frustum-shaped portion. The phenomenon of the self-pinning effect through the liquid level was clearly revealed. Its displacement was analyzed by image post processing. Sudden increase in its displacement can be observed and there were corresponding velocity peaks (FIG. 5C). The formation of multiple rings on a flat support or substrate has been observed by carefully controlling the solute and evaporation conditions. The multi-rings formation in the out-of-plane direction plays a key role in the detection of strain direction and strain distribution on the sensor body. The principle behind it should be similar to that for a flat support or substrate, as only gravity is introduced into the dynamic system and the mechanism, which is the balance between the pinning force, capillary force and gravity, does not change. The thickness of the multi-rings on the vertical sensor body was almost the same as the thickness of the rings that are formed on the flat substrate. The thickness in this instance refers to how far the ring protrudes from the surface on which it is deposited. The multi-rings could also be utilized to monitor the strain change on the sensor body by taking the adjacent rings as the connecting points and testing the resistance vibration (FIG. 5D). Following this strategy, multi-rings were induced on the flat substrate without any external assistance nor through control of the evaporation rate, but only through introduction of a vertical boundary by folding the flat film (FIG. 6A), which indicates that the present method can be used to achieve multi-rings.

Example 3C: Surface Profile Analysis of Multi-Rings on Sensor Body

Figure 12:
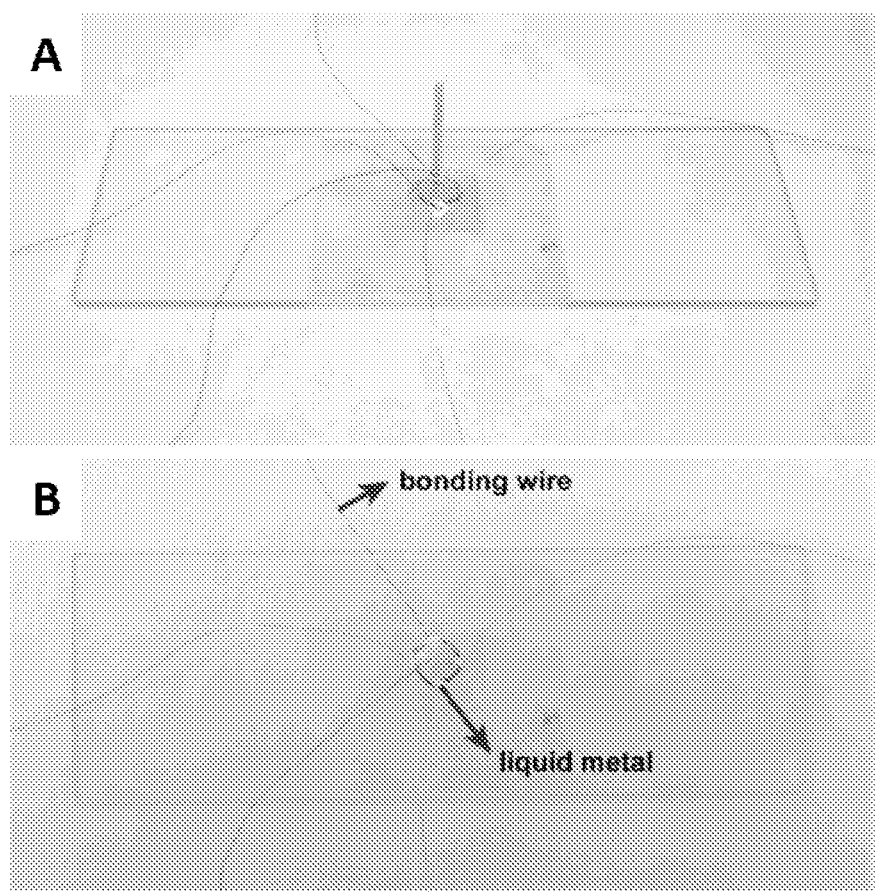
FIG. 12A shows a perspective view image of the five-point encapsulation method. Specifically, liquid metal, with high mobility and surface tension, which is ideal for flexible encapsulation, is employed to connect the sensing film with the bonding wires.
FIG. 12B shows a top view image of the five-point encapsulation method. Specifically, liquid metal, with high mobility and surface tension, which is ideal for flexible encapsulation, is employed to connect the sensing film with the bonding wires.

The detailed structure of the on-sensor-body ring was checked and it was found that there is a typical thickness gradient from the sensor body ring part (region ① of FIGS. 6C and 6D) to the sensor body inner thin part (region ②, FIG. 6C) which is verified by the gradient wavelength (FIG. 6E) according to the buckling theory. Similarly, multi-rings leave multiple gradient regions (FIG. 13B), and there is no throughout cracks in the thick ring part, as no strain is applied along the ring itself during the bending process. It is therefore ideal for the wire bonding by taking the connecting points on it (FIG. 3B and FIG. 12)

Figure 1C:
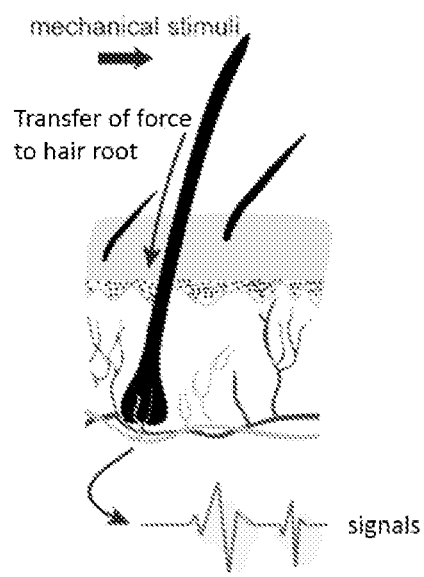
FIG. 1C shows a diagram of the response of tactile hairs to mechanical stimuli.
Figure 8:
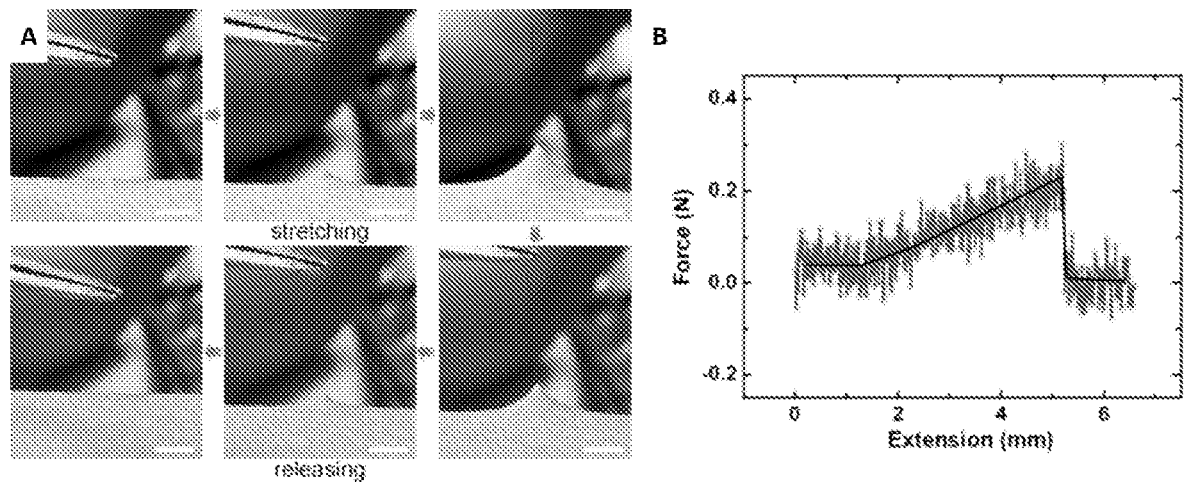
FIG. 8A demonstrates the stretchability of a real tactile hair on human body. The images present the stretchability of the sensing unit of the tactile hair by a stretching and releasing cycle. The hair is on the forearm of an asian male adult and operated by a tweezer. The scale bar denotes 5 mm.
FIG. 8B shows a plot of the extension-force curve of the real tactile hair.
Figure 10:
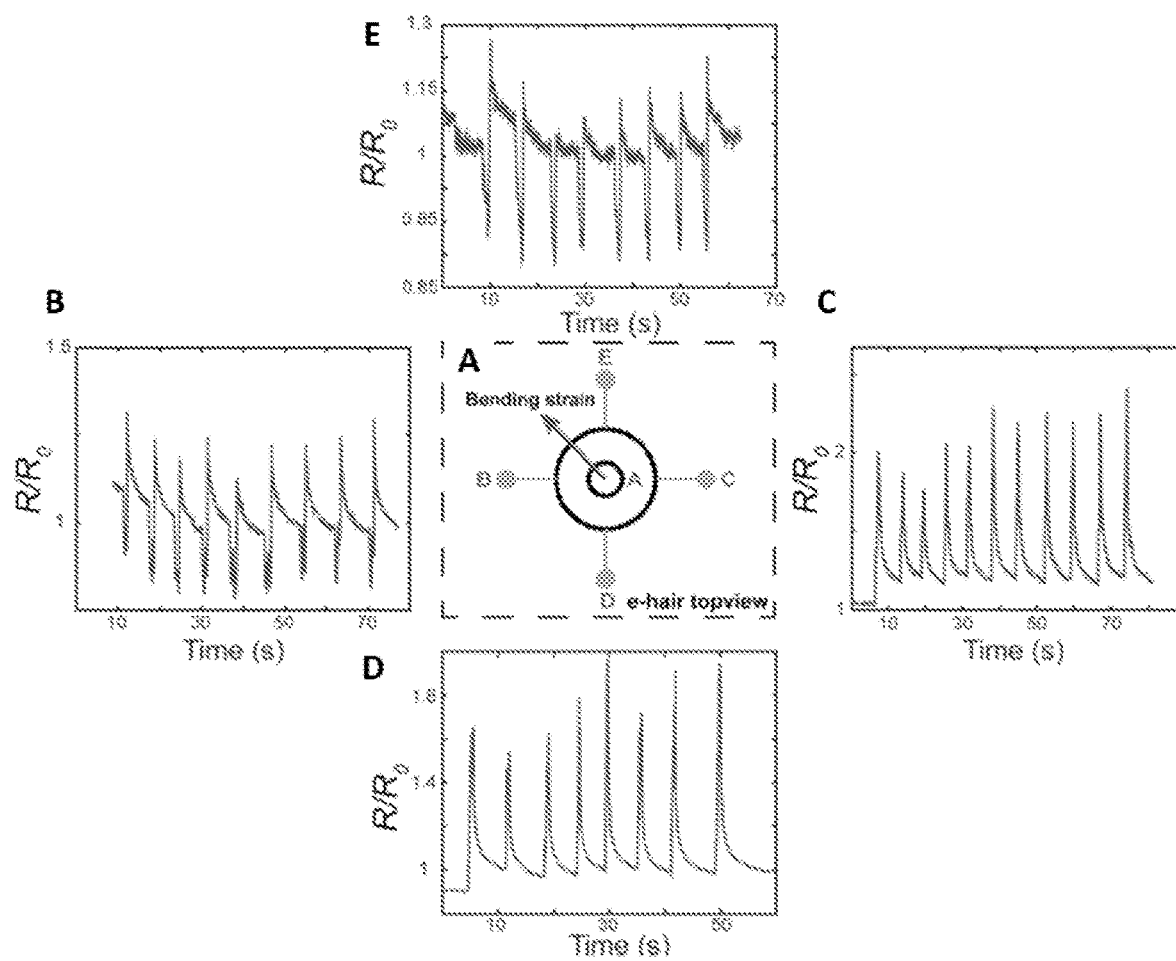
FIG. 10A is a diagram illustrating the direction recognition when the direction of the bending strain slopes to that of the encapsulation wires, under a five-points encapsulation method.
FIG. 10B shows the resistance change from point test A to point test B.
FIG. 10C shows the resistance change from point test A to point test C.
FIG. 10D shows the resistance change from point test A to point test D.
FIG. 10E shows the resistance change from point test A to point test E.

Example 4A: Multi-Strain Detection, Isotropic Stretchability and Strain Direction Recognition by Single Electronic Hair The as-prepared 3D-structured stretchable strain sensor is presented in FIG. 3B. The in-plane SWCNT film possesses stretchability. However, the stretchability of the SWCNT film in the out-of-plane direction in the sensing unit (in the root) had to be further studied. It is emphasized that a real fine hair on human body actually possesses the stretchable sensing unit (FIG. 1C and FIG. 8A), so the stretchability should be achieved in order to fully mimic the function of the tactile hair. This stretchability is important for the sensor. It can improve the sensing capability of the sensor even when undergoing mechanical strain that includes stretching, bending, compressing, etc. While conventional hair-like sensors showed great potential in mimicking the function of bending strain sensing of tactile hairs, they were unable to detect stretching strain and did not possess the flexible structure, which renders it difficult for their integration with other soft and stretchable sensing elements. To test the stretchability, the tensile strain was directly applied to the sensor body (FIG. 3C) and the strain induced in the sensing unit was modeled by FEM (FIG. 3D). The performance of the fabricated sensor was then tested with respect to its stretchability and strain-sensing function, especially for bending strain. The sensor (FIGS. 3C and 3D) displayed high stretchability (FIG. 3E). Moreover, it was able to detect and withstand at least 10,000 tensile strain cycles at 120% strain acting on the sensing unit (FIG. 3F and example 4B). It also showed excellent performance under compression strain (FIG. 9A). Therefore, the present 3D-structured stretchable strain sensor can be used to detect tensile and compression strain.

It was also verified that a hollow root structure possessed significantly greater strain sensitivity compared to a solid root (FIG. 9C). It would be highly desirable if a single 3D-structured stretchable strain sensor could also distinguish different strain directions, as it opens up for the exploration of complex flow patterns. According to the FEM simulation, the strain distribution in the root could be divided into four regions (see FIG. 2D, first column, middle row, and the inset of FIG. 11A), namely (i) tensile region, (iii) compressed region, and (ii, iv) two side regions. Thus, the strain direction could be recognized as long as regions (i) and (iii) were figured out. This could be accomplished by measuring the resistance between point A on the sensor body and points B, C, D, and E at the bottom ring (inset of FIG. 3B and FIGS. 12A to 12B). When bending strain was applied in one direction, for example, from point B to point C, $R_{AB}$ would increase with the bending angle due to the tensile strain, whereas $R_{AC}$ would initially decrease and then changed little. $R_{AD}$ and $R_{AE}$ changed marginally with increasing bending angle. This pattern of changes was stable over a large number of cycles (FIG. 11B) and enabled the determination of the strain direction. If the strain was applied in the direction in between AB and AE (FIG. 10A), the strain direction still can be determined. In this situation, $R_{AB}$ and $R_{AE}$ referred to the compression region and $R_{AC}$ and $R_{AD}$ referred to the tension region. For example, for a bending angle of 15°, $R_{AB}$ and $R_{AE}$ decreased while $R_{AC}$ and $R_{AD}$ increased (FIG. 10B to 10E, also see example 4C). Therefore, the sloping direction could also be determined using the five-point method. Following our proposed strategy, the accuracy in determining the bending strain direction could be improved further by increasing the connecting points on the lower ring.

Example 4B: Direction Recognition when Strain Direction Slopes to Encapsulation Wires Under the current five-point encapsulation method, if the direction of applied strain is on neither BC nor DE, but slopes at certain angle between them (FIG. 10A), the approach to identify the direction is as follows. Referring to $R_{AB}$ and $R_{AE}$ in FIG. 10A, they are in the compressed region and the tensile region is then represented by $R_{AC}$ and $R_{AD}$. The performance of $R_{AB}$, $R_{AC}$, $R_{AD}$ and $R_{AE}$ was checked, and it was found that both $R_{AB}$ and $R_{AE}$ decrease at a bending angle of 15°, and both $R_{AC}$ and $R_{AD}$ increase at the same time (FIG. 10B to FIG. 10E). Therefore, the sloping direction can be roughly identified by using this five-point method. Based on this method, the direction was more precisely recognized by increasing the connecting points on the lower ring.

Figure 11:
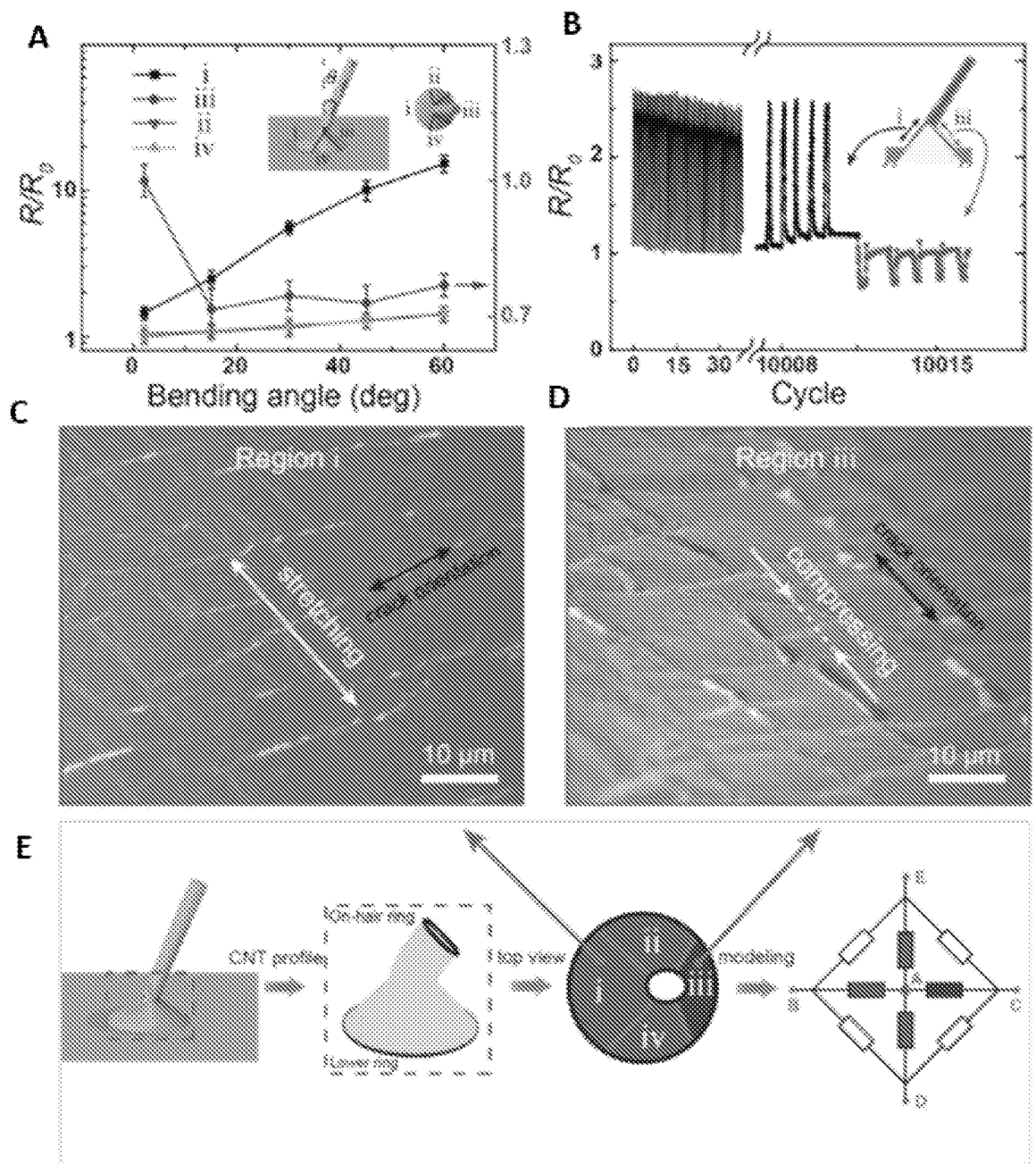
FIG. 11A shows the resistance network modeling based on the strain distribution and related surface morphology under bending strain. Specifically.
FIG. 11B demonstrates the durability of the sensor under bending strain. The inset presents a diagram of the tensile strain and compression strain regions at regions (i) and (iii), respectively. The compressive signal was collected during the cycling and presented at the end of the signal at region i.
FIG. 11C shows the cracks and wrinkles distribution in tensile region (region i) under a bending angle of 60°. The white arrow indicates the stretching direction and black arrow indicates the crack orientation. The scale bar denotes 10 μm.
FIG. 11D shows the cracks and wrinkles distribution in compressed region (region iii) under a bending angle of 60°. The white arrow indicates the compression direction and black arrow indicates the crack orientation. The scale bar denotes 10 μm.
FIG. 11E shows that the resistance network is abstracted through a three-step modeling. The four regions correspond to that analyzed in FIG. 2D (leftmost column, middle row) and the four resistors in the final model.

Moreover, $R_{AB}$ was highly sensitive to the bending angle. Here, the sensitivity, i.e. the gauge factor (GF), is defined as $GF=\Delta(R/R_0)/\Delta\theta$, so GF was about 24% deg.$^{-1}$ (FIG. 11A), i.e. when it has only 1 bending degree changed, $R_{AB}$ increases by 24%. The present 3D-structured stretchable strain sensor, with this high sensitivity, can detect the pressure driven by the soft wind and water flow as demonstrated in example 5A. The stability for the bending process was also tested and it showed repeatable performance of $R_{AB}$ and $R_{AC}$ even after 10,000 bending cycles at bending angle of 15° (FIG. 11B).

Example 5A: Mechanism of High Performance and its Corresponding Demonstration

Figure 13:
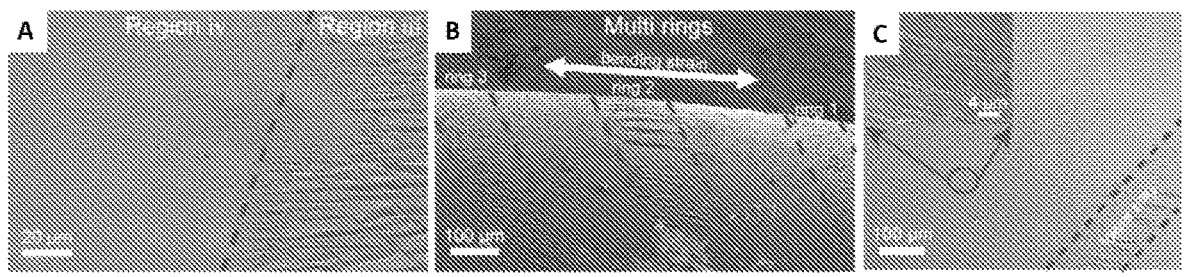
FIG. 13A shows a FESEM image of the 3D-structured stretchable strain sensor under bending strain. Specifically.
FIG. 13B shows a FESEM image of the 3D-structured stretchable strain sensor under bending strain. Specifically.
FIG. 13C shows a FESEM image of the 3D-structured stretchable strain sensor under bending strain. Specifically.
Figure 14:
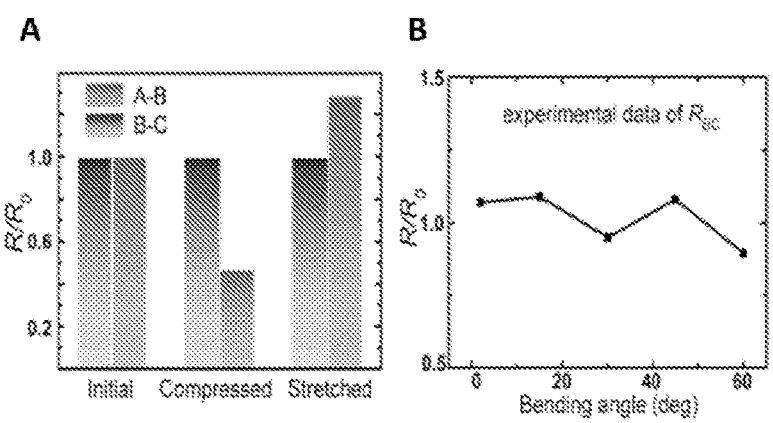
FIG. 14A shows the change in resistance predicted using a resistance network model of FIG. 11E.
FIG. 14B shows the experimental data of the resistance vibration from point B to point C.

To further understand the mechanism behind the resistance change, the surface morphology in the four regions was studied under bending strain of a single 3D-structured stretchable strain sensor. It can be seen that formation of cracks and wrinkles under strain differs significantly between the regions (FIG. 13A to 13C). For instance, when the bending strain was applied from point B to point C, the induced cracks aligned orthogonally to the stretching direction in region (i) (FIG. 11C), resulting in an increase in resistance $R_{AB}$. Conversely, in the compression direction (region iii), the induced wrinkles aligned orthogonally to the compression direction, thereby shortening the conductive path, leading to a reduction in resistance $R_{AC}$. Moreover, the SWCNTs film can be modeled by a resistance network (FIG. 11E, also see example 5B). It can be seen that point A was vital for breaking the symmetry of the circuit, thus enabling the determination of the direction of the applied strain (FIGS. 14A and 14B, also see example 5C).

Figure 15:
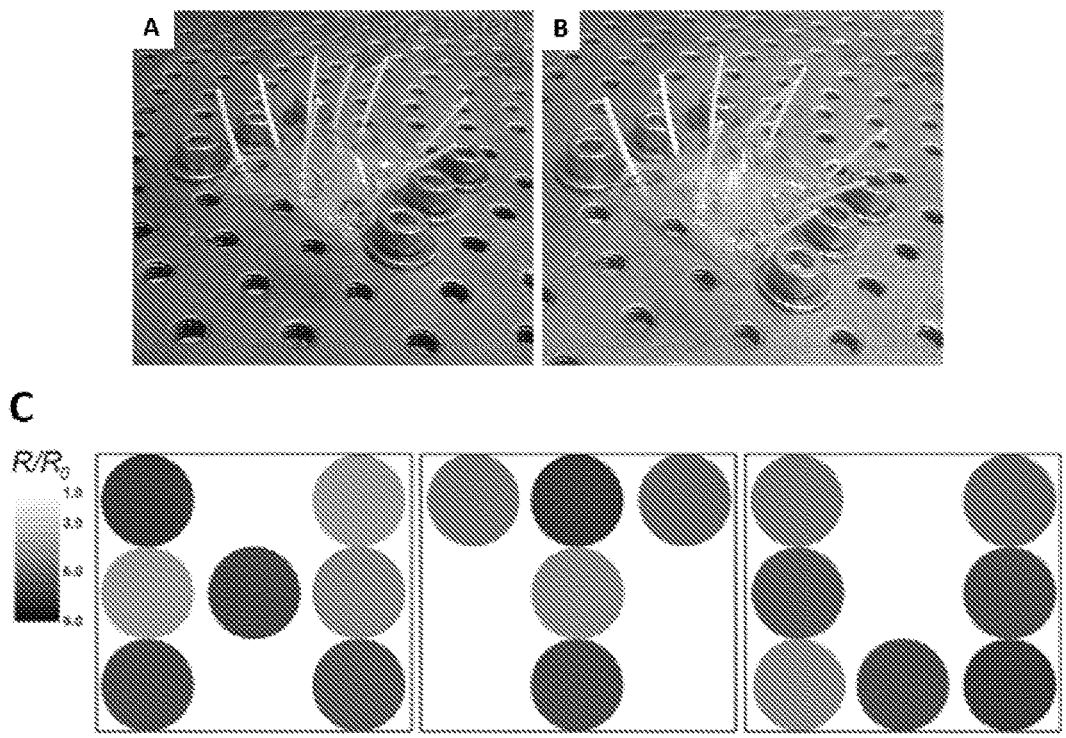
FIG. 15A shows an image that presents how the isotropic strain is applied in practice with smaller strain compared to that of FIG. 15B.
FIG. 15B shows an image that presents how the isotropic strain is applied in practice with larger strain compared to that of FIG. 15A.
FIG. 15C shows how the sensor array could be used to identify the touching pattern, like a 'NTU' pattern.

The performance of the fabricated 3D-structured stretchable strain sensor under isotropic strain was also of importance for real applications as the sensor was inevitably exposed to multidimensional strains. To achieve isotropic stretchability, a more complicated design was required. A CNT film formed by self-pinning effect on a 2D flat substrate demonstrated isotropic stretchability, and studies were conducted to check the isotropic stretchability of the sensor fabricated by 3D self-pinning. First, the 3D-structured stretchable strain sensor array was successfully fabricated (FIG. 15A). The two edges of the array were fixed on a hollowed rigid substrate. Then, a vertical stress is applied from the bottom using a stick (FIG. 15B). The isotropic strain, $\varepsilon_I$, was estimated as $A/A_0$, where A is the apparent area of the lower ring after applying isotropic strain and $A_0$ is its initial area. Under an applied isotropic strain of $\varepsilon_I$=50% to the substrate, the bending strain was applied to the sensor body and the resistance was monitored in different strain domains. It was found that the overall trend of the resistance changes ($R/R_0$) remained similar to the sample without isotropic strain applied (FIG. 11A and FIG. 9B). This result revealed that the sensor array performs excellently under pre-exposure to isotropic strain. Moreover, it can be fully used to recognize the tactile pattern, for example, a tactile path with "NTU" shape (FIG. 15C). This ability of pattern recognition is of importance for the electronic-skin and smart robots providing them with the ability to sense external stimuli without being in direct physical contact with the sensor system.

Figure 16:
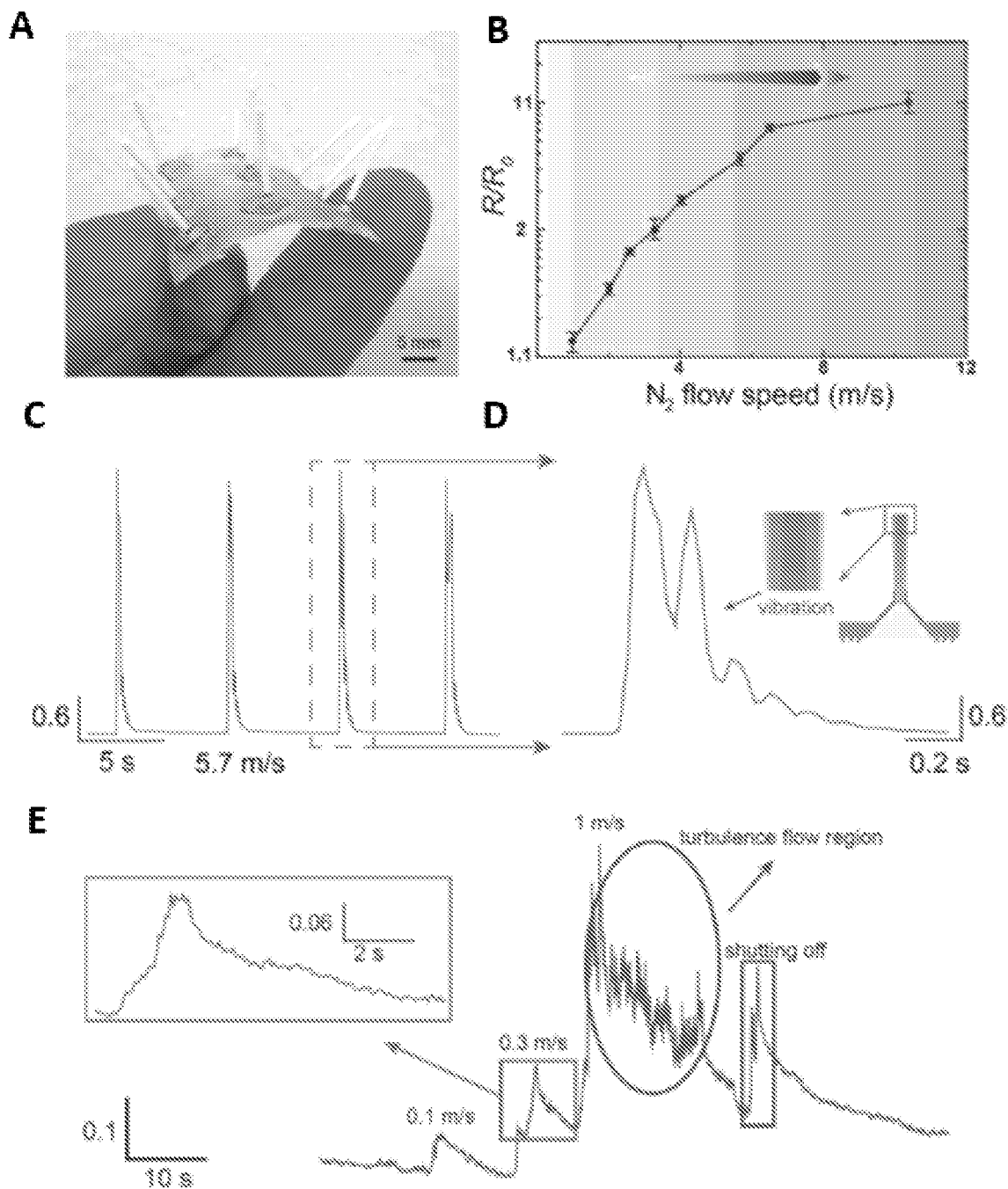
FIG. 16A shows a photograph of the sensor array for its isotropic stretchability of the sensor array and for detection of subtle fluid flow. The scale bar denotes 5 mm.
FIG. 16B shows a plot of normalized resistance change under different speeds ranging from about 1 to about 11 m s$^{-1}$.
FIG. 16C shows the stability of the detection signals under the nitrogen speed of 5.7 m s$^{-1}$.
FIG. 16D shows an amplified view that reveals damping vibration dominates the later part of the signal as illustrated in the inset.
FIG. 16E shows a signal obtained under different water speeds corresponding to two different flow states: laminar and turbulent flow. The square (outlined in green) indicates a typical signal of laminar flow and its inset shows the magnified view. The ellipse (outlined in red) highlights the typical vibration signal of the 3D-structured stretchable strain sensor induced by turbulent flow. The rectangle (outlined in red) shows the signal induced by the sudden shut-off of the water flow.
Figure 17:
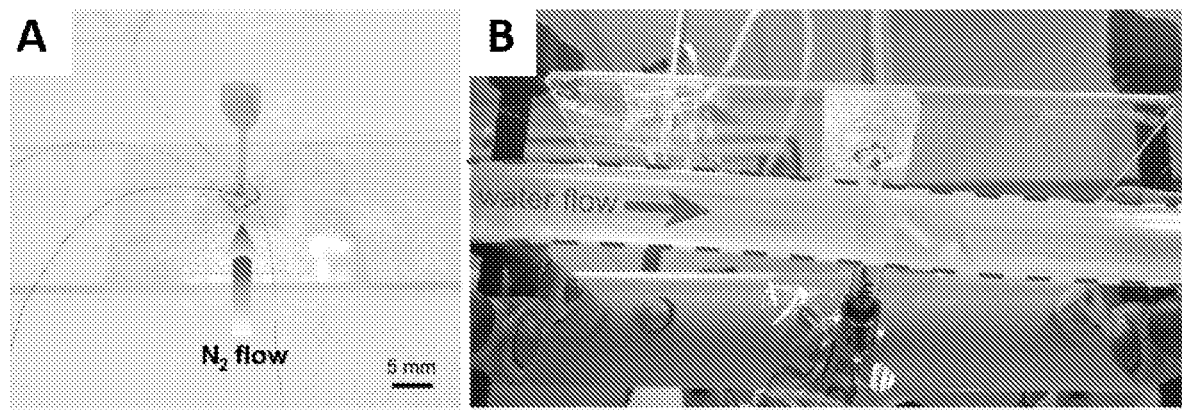
FIG. 17A shows an image to illustrate the detection of wide-range speed of nitrogen gas flow by tip-modified sensor. The scale bar denotes 5 mm.
FIG. 17B shows an image that presents the setup of detecting water flow. Diameter of the tube is 5 mm.
Figure 18:
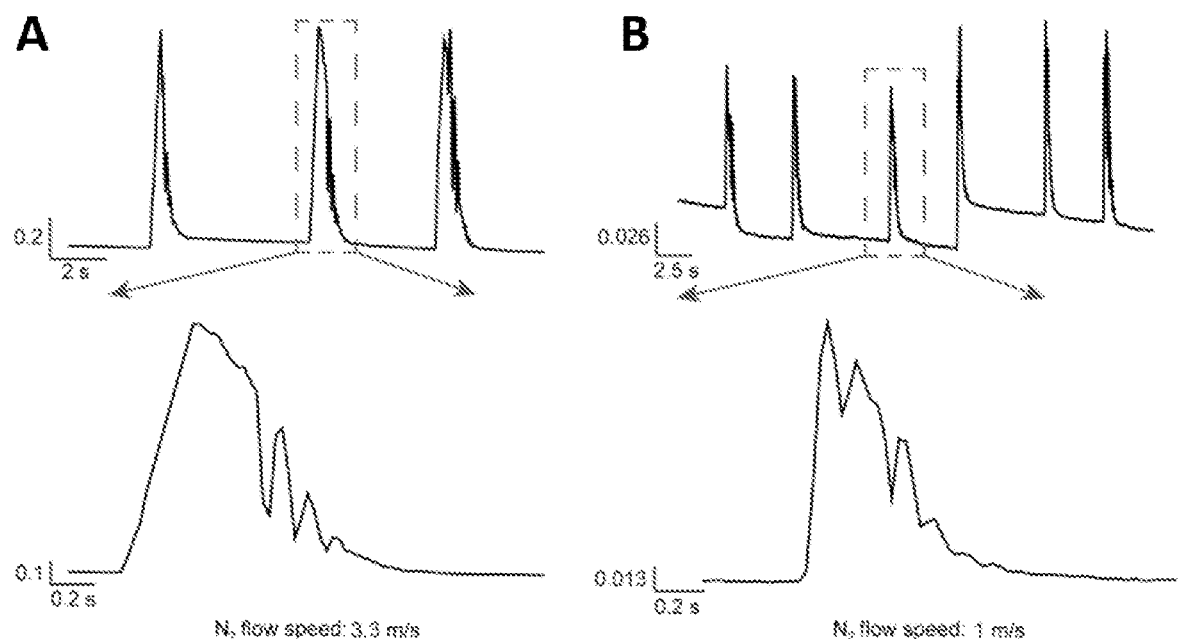
FIG. 18A shows the resistance response for a gas speed of nitrogen of 3.3 m/s.
FIG. 18B shows the resistance response for a gas speed of nitrogen of 1 m/s.

Finally, the 3D-structured stretchable strain sensor (FIG. 16A) was demonstrated for detection of gas and water flow at high sensitivity. When the sensor was subjected to light gas flow of 0.3-1.5 m/s (the weakest wind speed region in which wind starts to be visible in smoke), a 20% change in resistance can be observed. For the region referred to as fresh breeze (8.0-10.7 m/s), the resistance increased by a factor of about 10 (FIG. 16B and FIG. 17A). More excitingly, even pulsed gas pressure for both low and high wind speeds can be monitored through the damped vibrations of the sensor body (FIG. 16C, FIG. 16D, FIG. 18A, FIG. 18B, and also see example 5D). Water flow detection, on the other hand, occurred through static rather than vibration strain induced in the sensor root by the water pressure (FIG. 17B). This was because the viscosity of water is much larger than that of gases. It was noted that the sensor can detect different flow states and even the shock induced by the fluid inertia due to sudden shut-off of water (FIG. 16E and also see example 5E). This ability to sense the gas/fluid flow could benefit the wind/fluid field analysis during applications such as underwater robotics and flying control. Additionally, the size of the 3D-structured stretchable strain sensor could be scaled down by more precise 3D printing technology to prepare the template. Since the carbon nanotube is very small, there was no barrier at the side of active materials to scale down. However, the wire bonding and encapsulation could be the barrier because the operational complexity would increase dramatically with the decrease of the size. This could be overcome by standardizing the manufacture process and arranging operation under the help of industrial robots. Also, for the further commercial product, 3D printing method could be replaced by the modular integration. The hair body with rigid core, the hollowed cone structure underneath, and the film substrate could be fabricated separately. Then, they are assembled together by proper soft glue, as long as the assembling process would not affect the original mechanical design to keep the effective strain transfer.

Example 5B: Resistance Network Modeling

The resistance model can be built up as illustrated in FIG. 11E. Since there is only one connecting point on the sensor-body ring, it was equivalent to an equipotential node. The lower ring was divided into four parts by the four connecting points. The four strain domains were turned to act as four resistors, accordingly. By applying the classical Kirchhoff's law, the following equation may be derived:

$$\sum_i I_i = 0, \sum_k V_k = 0$$

where i is ith node, k is the kth circuit, I is the current and V is the voltage.

The equivalent resistance between every two nodes could be calculated. Thus, the strain applied situation could be simulated by increasing or decreasing $R_n$ (n=i, ii, iii and iv) according to the different strain domains. Due to the symmetry of this circuit, only the resistances of $R_i$ and $R_{iii}$ were tuned, and the equivalent resistances of $R_{AB}$ and $R_{BC}$ were calculated to investigate whether the experimental data was explainable (FIG. 11A) and to prove that it was the breaking of the circuit symmetry that helped to distinguish the direction of strain applied (FIG. 14A). When the bending strain was applied from B to C or from C to B, $R_{BC}$ did not change at all due to the symmetry of this circuit which was also proven by the experimental data (FIG. 14B).

Example 5C: Discussion on Resistance Change in Different Strain Region

Figure 19:
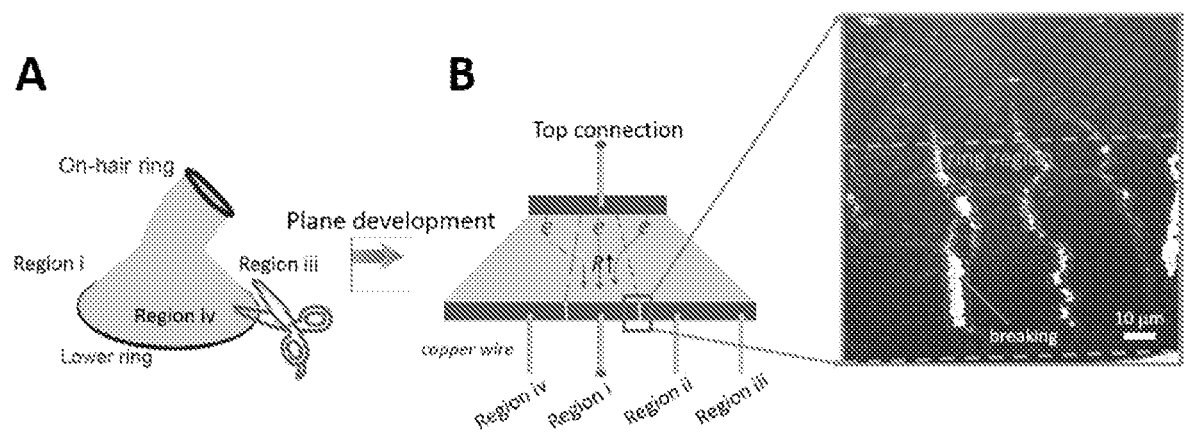
FIG. 19A shows the plane development of the 3D-structured CNT film and related surface morphology. Specifically.
FIG. 19B shows the plane development of the 3D-structured CNT film and the FESEM image of the surface morphology of bottom thick CNT ring in tensile strain region (region (i)). The electron pathways in different regions are illustrated in the left panel and it is restrained in region (i) due to the throughout breaking in the bottom thick CNT ring. The scale bar of the magnified image denotes 10 μm.

In order to further understand the resistance change in different regions, the electron pathway was analyzed in detail. When the testing voltage was applied between the top point and one of the bottom points, although the resistance in different regions was interconnected, the dominating region was in between the testing two points, taking the tensile region (region (i) in FIG. 11A) as an example. Firstly, the structure of the 3D CNT film formed by the capillary force-assisted 3D self-pinning effect was reviewed. The final film was made of two thick CNT rings and the CNT thin film in between the rings (FIG. 3A, FIG. 19A and FIG. 19B). For the two thick CNT rings, one was at the hair body which suffered little strain due to the rigid core inside the hair body and the other one was at the bottom but still located in the tensile region. Since the CNT ring was much thicker than CNT thin film, it was easy to break under a small tensile strain. Therefore, the bottom CNT ring has throughout cracks observed (SEM image of FIG. 19). When considering the resistance in the tensile region (region (i)), in order to make it more understandable, the plane development of the 3D-structured CNT film was studied by cutting region (iii) (FIG. 19). Due to the throughout cracks in the bottom CNT ring, when the voltage was applied between top ring and bottom ring in region i, the electron pathway was restrained in region (i) for the whole film (FIG. 19B), indicating that the resistance change of the whole film was dominated by the conducting path length in region (i). Because the CNT thin film suffered the tensile strain in region (i), the micro cracks generated would increase the path length, making the resistance larger as shown in FIG. 11A. The same principle can be used to analyze the resistance change for other regions.

Example 5D: Time Response of the Resistance Resuming Baseline

Figure 20:
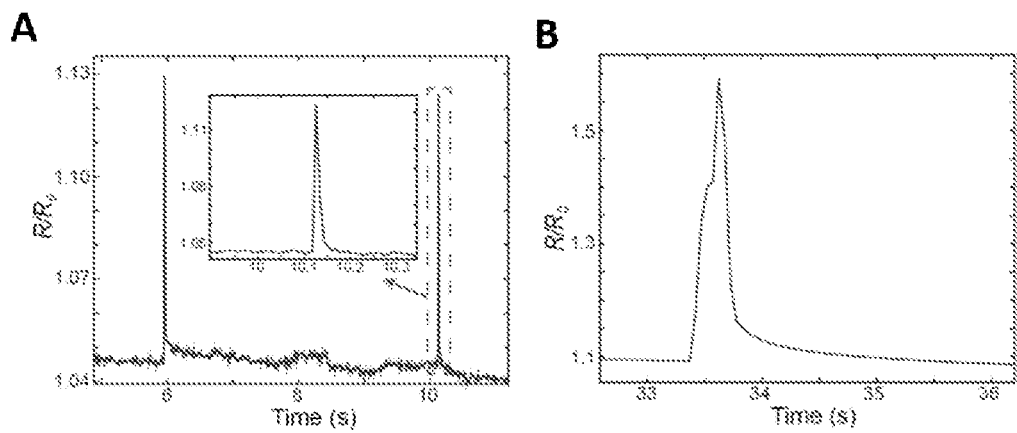
FIG. 20A shows the detailed characterization of the time response when resistance change is induced by a subtle vibration.
FIG. 20B shows the detailed characterization of the time response when resistance change is caused by bending strain and the bending angle θ is only about 5 degrees.

In order to characterize the time response in detail, a subtle vibration and relatively large strain (5 degree bending) were applied to the sensor. The very short vibration was applied to the sensor by the sudden knocking on the table where the sensor was fixed and the vibration induced was quite subtle. It could be observed that the time response to this subtle vibration was much shorter, only about 0.05 s (FIG. 20A) while the 5 degree bending induced about 1 s (FIG. 20B), although the bending angle was relatively small. Therefore, the time response strongly depended on the amplitude of the strain applied.

This hysteresis behavior should originate from the polymer substrate itself, but not from CNT. The loading and unloading of mechanical strain resulted in the open and close of the micro cracks in the CNT film (FIG. 11C and FIG. 11D), inducing the increase and decrease of the resistance. Since the relaxation time of the electron passing through the contact area of CNT was very small, this relatively larger time response did not result from the CNT itself. For stretchable polymers, there was an intrinsic property that the stretchability resulted from the conformation change of the molecules during the stretching. When a subtle strain was applied to the polymer, it could recover rapidly. However, when a relatively larger strain was applied, the relaxation time of this conformation change was about 1 second. The macroscopic expression of this relaxation time of conformation change was that the strain releasing process was slower, the cracks closing in CNT film was postponed, and there was a delay for the resistance back to the baseline. The subsequent signal processing was conducted more precisely to resolve this. For conventional rigid sensors, the signal processing was quite simple, and the mechanical strain could be read out from the present resistance value. For the present stretchable strain sensors, the history of the resistance signal should be included to gauge whether the sensor was previously in a stretching or recovering process, and the strain could then be figured out from the resistance value.

Example 5E: Detection of Different Fluid Flow State

The increase in resistance, induced by the fluid flow, was not as sharp as that under nitrogen pressure and it decreased to some extent but not to its original state. This reflected the balance building process (inset of FIG. 16E). Moreover, the sensor could still record the signal induced by different speed of water flow, indicating that the sensor could be utilized to distinguish the fluid speed and state transformation, which is critical for fluid flow sensing. Specifically, once the switching of input water was suddenly shut off, vibration wave inside the water induced by the fluid inertia occured, which could be recognized by the sensor (FIG. 16E). When the speed increases to around 1 m/s in a rubber tube with a diameter of 5 mm (Reynolds number is about 5000), the flow state turned turbulent, which was a typical transformation in fluid, and this could be reflected in the signal monitored.

Example 6: Summary

The examples, already described above, provides demonstration on a 3D-structured stretchable strain sensor that has multi-functional sensing ability, which includes the detection of tension, compression, bending, and distinguishing the strain direction by a single sensor. Such detection allows for the basic function of sensing air flow, water flow and other subtle touches that does not arise from direct contact with the skin. In order to mimic such detection functions, the sensor as disclosed herein is derived from a method/design that renders the electronic-hair highly sensitivity, and having isotropic stretchability, based on an integrated consideration of the sensor structure and the materials.

Analysis of structural mechanics is one of the consideration involved for deriving the structure of the electronic-hair by considering the efficient strain transferring from the hair body to the sensing unit below. Such a design maximizes the strain concentration and its covering area in the root, thereby achieving high sensitivity. Starting from the simplest structure and obtaining the desired gradient hollowed root with stiffener inside the hair after a four-step consideration was achieved with the help of FEM simulation.

The present method also involves capillary force-assisted 3D self-pinning effect, utilizing the advantage of both the climbing provided by the capillary force and self-assembling process of the self-pinning effect. This seamless integration meets all the above requirements of the electronic-hair even including the ability to distinguish the direction of the strain applied which is critical for many applications. The mechanism behind this ability has already been discussed above and the key point is to break the symmetry of the resistance networks under the assistance of multiple out-of-plane rings supported by the present method disclosed herein. Many other schemes could be carried out based on the present method by employing other active materials to achieve the direction recognition of the strain applied. Like the real hair, the electronic hair can be easily integrated in a large scale and used to detect multi strains, very soft fluid flow. Other flow details can be further monitored, such as flow speed, damping vibration, quasi-static force balance, and flow state. Additionally, it has to be emphasized that 3D printing technology and a solution-based fabrication method are employed to render the fabrication of the present sensor cost-efficient and high-yielding, even on a large scale. The present method and sensor provide opportunity for exploration of new sensing units for applications in artificial skin, smart under-water robot, flow field analysis, etc., constituting an advancement in the field of interactive sensing and adaptable interfaces.

Example 7: Commercial and Potential Applications

Soft tactile hairs, which exist extensively on animal and plant surfaces, have evolved into powerful self-amplified strain-sensing machinery that is vital for subtle strain detection. The unique feature of this machinery is that its sensory units are stretchable and embedded in 3D architecture, which poses a challenge for biomimic fabrication. The present method, however, overcomes the challenge and provides for fabrication of stretchable tactile electronic hairs (e-hairs) by employing 3D printing in conjunction with out-of-plane capillary force-assisted self-pinning of carbon nanotubes. The present sensor, from the present method, mimics the mechanical sensing functions of tactile hairs in terms of stretchability, multi-strain detection, and strain-direction recognition by a single e-hair. The present method, accordingly, provides for fabrication of future 3D stretchable electronic sensors, which can be applied in skin diagnostics, robotics and other electronic applications.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A sensor comprising a support and a flexible structure arranged on the support, the flexible structure comprising:
   a frustum-shaped portion having a wider end and a narrower end, wherein the wider end of the frustum-shaped portion is arranged proximal to the support, and
   an elongated portion extending from the narrower end of the frustum-shaped portion, the elongated portion comprising a tubular portion having a core-shell structure, wherein the core has a Young's modulus greater than that of the shell,
   wherein the flexible structure further comprises a stretchable conducting film arranged on the frustum-shaped portion.

2. The sensor according to claim 1, wherein the frustum-shaped portion is integral with the support.

3. The sensor according to claim 1, wherein (i) the diameter of the wider end of the frustum-shaped portion, (ii) the diameter of the narrower end of the frustum-shaped portion, and/or (iii) the height of the frustum-shaped portion are configured so that a lateral surface connecting the wider end and the narrower end of the frustum-shaped portion forms an acute angle with respect to the wider end of the frustum-shaped portion.

4. The sensor according to claim 1, wherein the frustum-shaped portion is a hollow structure.

5. The sensor according to claim 1, wherein a portion of the frustum-shaped portion is embedded within the support.

6. The sensor according to claim 1, wherein the core is formed of a material selected from the group consisting of polylactic acid, polyethylene terephthalate, polyethylene trimethylene terephthalate, and polyamide.

7. The sensor according to claim 1, wherein the shell is formed of a material selected from the group consisting of polydimethylsiloxane and polyurethane.

8. The sensor according to claim 1, wherein the stretchable conducting film comprises carbon nanotubes, whereby the carbon nanotubes define one or more concentric rings on the frustum-shaped portion and/or on the support abutting the frustum-shaped portion.

9. The sensor according to claim 1, wherein a plurality of the flexible structures are arranged on the support.

10. The sensor according to claim 1, wherein the sensor further comprises a unit for measuring a force applied on the flexible structure of the sensor.

11. A method of preparing a sensor, the method comprising:
   providing a support and a flexible structure arranged on the support, the flexible structure comprising a frustum-shaped portion having a wider end and a narrower end, wherein the wider end of the frustum-shaped portion is arranged proximal to the support, and an elongated portion extending from the narrower end of the frustum-shaped portion, the elongated portion comprising a tubular portion having a core-shell structure, wherein the core has a Young's modulus greater than that of the shell; and arranging a stretchable conducting film on the frustum-shaped portion of the flexible structure.

12. The method according to claim 11, wherein providing the support and the flexible structure comprises providing a template structure for deriving the flexible structure, or for deriving the support and the flexible structure as an integrally formed structure, and disposing a polymeric solution onto the template structure.

13. The method according to claim 12, wherein disposing the polymeric solution onto the template structure comprises preparing the polymeric solution by mixing a polymer and a cross-linking agent in a suitable solvent, and curing the polymeric solution on the template structure to obtain a cross-linked polymer.

14. The method according to claim 12, further comprises separating the flexible structure, or the support and the flexible structure as an integrally formed structure, from the template structure to form the frustum-shaped portion as a hollow structure.

15. The method according to claim 11, wherein providing the support and the flexible structure comprises subjecting the support and the flexible structure to oxygen plasma to render a surface of the support and the flexible structure hydrophilic.

16. The method according to claim 11, wherein arranging the stretchable conducting film on the frustum-shaped portion of the flexible structure comprises arranging the stretchable conducting film in the form of one or more concentric rings on the frustum-shaped portion and/or on the support abutting the frustum-shaped portion.

17. The method according to claim 11, wherein arranging the stretchable conducting film on the frustum-shaped portion of the flexible structure comprises disposing a suspension comprising the stretchable conducting film material on the frustum-shaped portion.

18. The method according to claim 11, wherein the method further comprises connecting the sensor to a unit for measuring a force applied to the flexible structure.

\* \* \* \* \*